United States Patent [19]
Trimberger

[11] Patent Number: 6,167,558
[45] Date of Patent: Dec. 26, 2000

[54] METHOD FOR TOLERATING DEFECTIVE LOGIC BLOCKS IN PROGRAMMABLE LOGIC DEVICES

[75] Inventor: Stephen M. Trimberger, San Jose, Calif.

[73] Assignee: Xilinx, Inc., San Jose, Calif.

[21] Appl. No.: 09/026,953

[22] Filed: Feb. 20, 1998

[51] Int. Cl.⁷ .................................................. G06F 17/50
[52] U.S. Cl. .............................................................. 716/16
[58] Field of Search ......................... 395/500.02–500.22; 716/1–21

[56] References Cited

U.S. PATENT DOCUMENTS

| | | | |
|---|---|---|---|
| 4,380,811 | 4/1983 | Gotze et al. | 714/710 |
| 4,920,497 | 4/1990 | Upadhyaya et al. | 716/17 |
| 5,369,314 | 11/1994 | Patel et al. | 326/13 |
| 5,430,734 | 7/1995 | Gilson | 714/725 |
| 5,434,514 | 7/1995 | Cliff et al. | 326/12 |
| 5,592,102 | 1/1997 | Lane et al. | 326/10 |
| 5,777,887 | 7/1998 | Marple et al. | 716/4 |
| 5,815,404 | 9/1998 | Goetting et al. | 716/16 |

FOREIGN PATENT DOCUMENTS

| | | | |
|---|---|---|---|
| 0351983 | 1/1990 | European Pat. Off. | G06F 11/20 |

OTHER PUBLICATIONS

"The Programmable Logic Data Book", (1996), available from Xilinx, Inc., 2100 Logic Drive, San Jose, California 95124, pp. 4–11 through 4–23.

Fran Hanchek, Shantanu Dutt; "Node Covering Based Defect and Fault Tolerance Methods for Increased Yield in FPGAs", presented for the 9th International Conference VLSI Design, Jan. 1996, 4 pages.

*Primary Examiner*—Kevin J. Teska
*Assistant Examiner*—Phallaka Kik
*Attorney, Agent, or Firm*—Patrick T. Bever; Jeanette S. Harms

[57] ABSTRACT

A fault tolerance method for FPGAs featuring interconnect resources made up of wiring segments that are programmably coupled to two or more configurable logic blocks (CLBs) through connection switches. In accordance with a first embodiment, one of the wiring segments is designated as being reserved for each CLB. During routing, a wiring segment is assigned to a signal path only if the signal path is not associated with signal transmission to or from the CLB to which the wiring segment is reserved. In accordance with a second embodiment, one or more connection switches are designated as reserved switches for each horizontal segment. During routing, the reserved switches are not used to route signal paths. Fault tolerance is then performed by shifting the logic portion assigned to a defective CLB and/or the associated switch configuration data along its row towards a spare CLB located at the end of the row. Accordingly, the signal path is shifted away from the defective CLB to a functioning CLB without changing the wiring segment assigned to the signal path, and, therefore, without changing the timing specification of the signal path. If the wiring segments are staggered such that adjacent wiring segments are selectively coupled to different groups of logic blocks in the same row, then fault tolerance adjustments do not introduce significant restrictions on interconnect resource allocation.

15 Claims, 12 Drawing Sheets

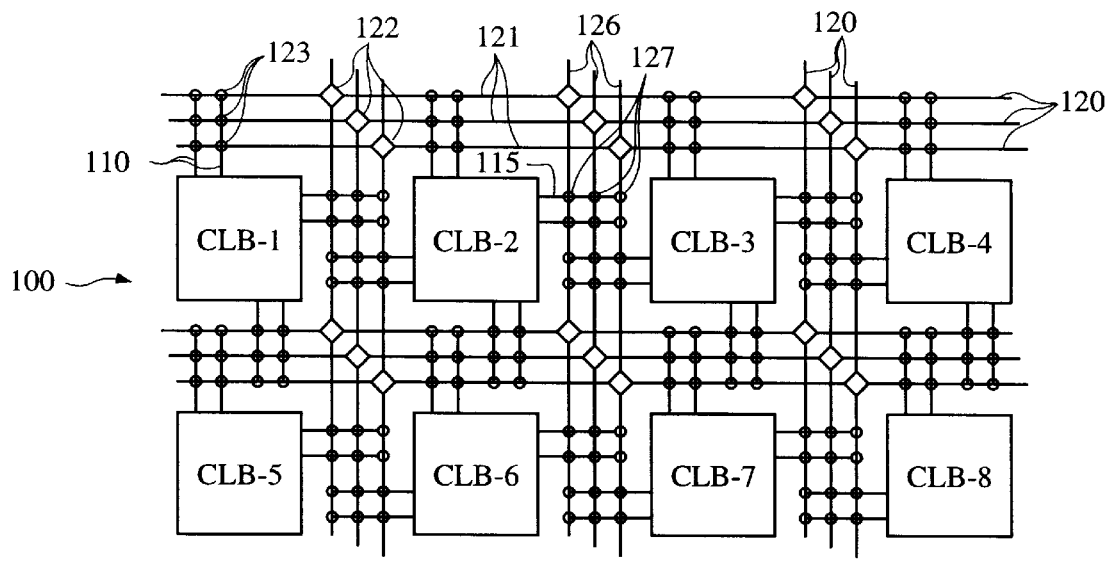
FIG. 1(A)
(PRIOR ART)
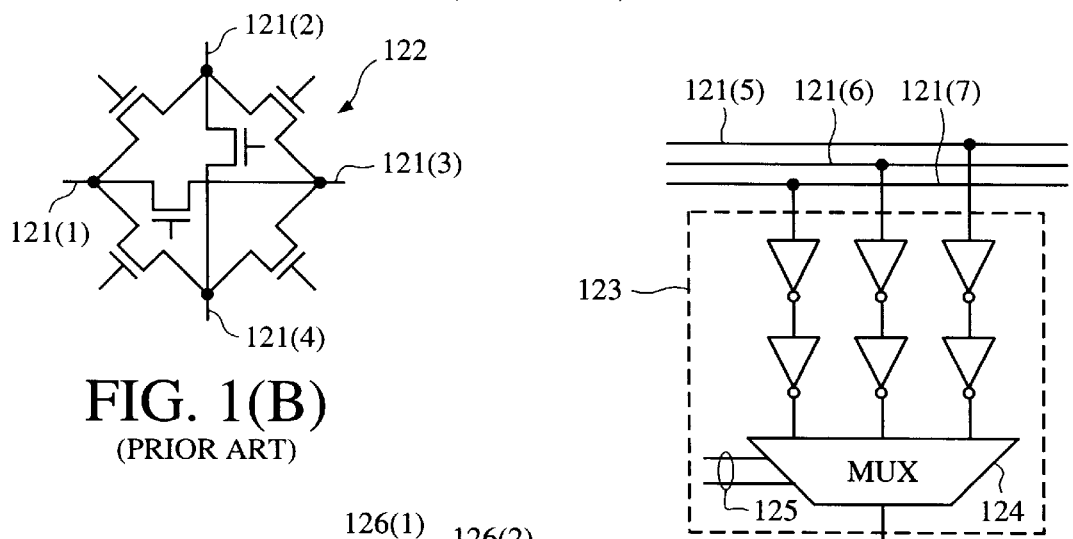
FIG. 1(B)
(PRIOR ART)
FIG. 1(C)
(PRIOR ART)
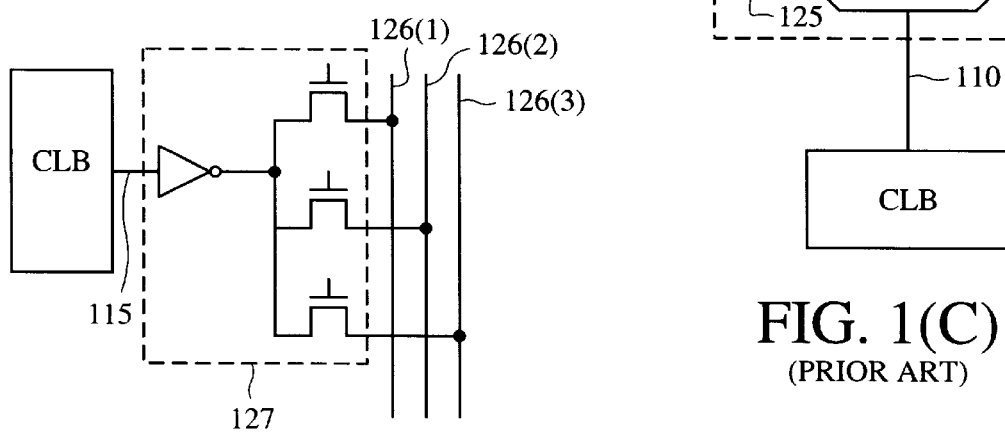
FIG. 1(D)
(PRIOR ART)

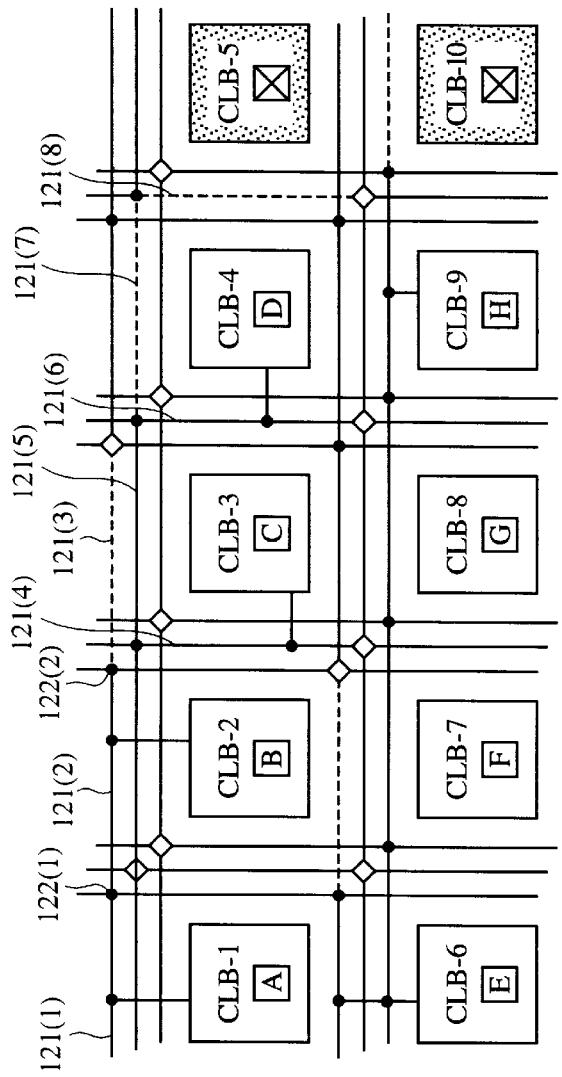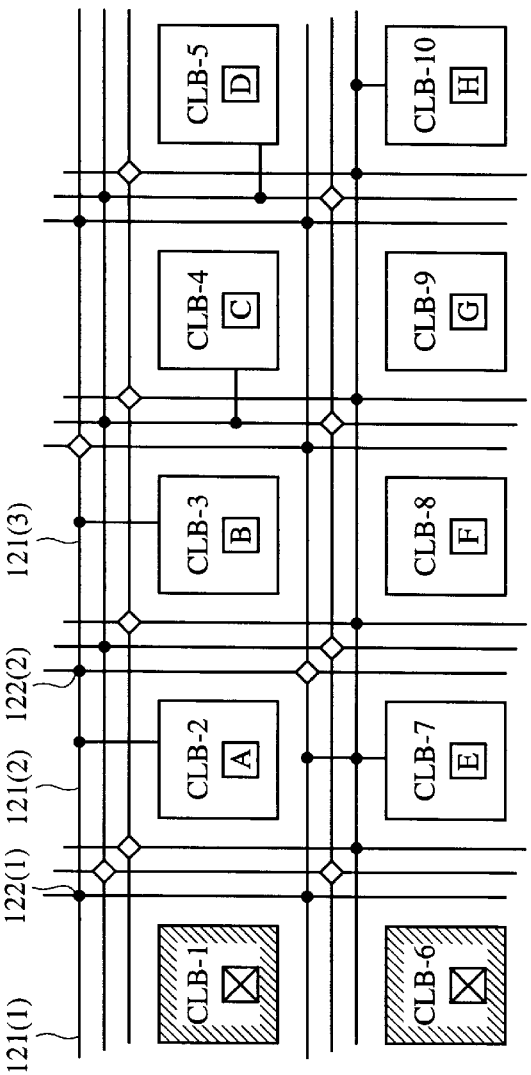
FIG. 3(A) (PRIOR ART)
FIG. 3(B) (PRIOR ART)

METHOD FOR TOLERATING DEFECTIVE LOGIC BLOCKS IN PROGRAMMABLE LOGIC DEVICES

FIELD OF THE INVENTION

The present invention relates to programmable logic devices (PLDs), and more particularly to methods for tolerating defective logic elements in PLDs.

BACKGROUND OF THE INVENTION

Programmable logic devices (PLDs) typically include a plurality of logic elements and associated interconnect resources that are programmed by a user to implement user-defined logic operations (that is, a user's circuit). PLDs are programmed using a personal computer or workstation, appropriate software and a device programmer. Therefore, unlike application specific integrated circuits (ASICs) that require a protracted layout process and an expensive fabrication process to implement a user's logic operation, a PLD may be utilized to implement the logic operation in a relatively quick and inexpensive manner.

FIG. 1(A) shows a portion of a field programmable gate array (FPGA) 100, which is one type of PLD. Although greatly simplified, FPGA 100 is generally consistent with XC3000™ series FPGAs, which are produced by Xilinx, Inc. of San Jose, Calif. FPGA 100 includes an array of configurable logic blocks CLB-1 through CLB-8, and programmable interconnect resources which include interconnect lines 120 extending between the rows and columns of CLBs. Each CLB includes configurable combinational circuitry and optional output registers, and conductive wires 110 which extend from the CLB for selective connection to the interconnect lines 120. All of the CLBs of an FPGA are typically identical. Each interconnect line 120 includes a series of wiring segments 121 that span the length of one CLB and are programmably coupled at their respective ends via programmable multi-way segment-to-segment switches 122. As shown in FIG. 1(B), each multi-way segment-to-segment switch 122 selectively connects a wiring segment 121(1) to any of three adjacent segments 121(2), 121(3) and 121(4) via pass transistors that are controlled by memory cells (not shown). In addition, each horizontal wiring segment 121 is connectable to the conductive wires 110 of associated CLBs via segment-to-CLB input switches 123. As shown in FIG. 1(C), each segment-to-CLB input switch 123 includes a multiplexer (MUX) 124 having inputs connected to wiring segments 121(5) through 121(7) through buffers, and an output that is connected to CLB input wire 110. A memory device (not shown) transmits control signals on select lines 125 such that the MUX 124 passes a signal from one of the wiring segments 121(5) through 121(7) to the associated CLB. Finally, signals are output from each CLB on lines 115 to a vertical wiring segment 126 via CLB-to-segment output switches 127 (these switches may also be used to output signals to horizontal wiring segments 121). As shown in FIG. 1(D), each output switch 127 includes a series of pass transistors controlled by memory devices (not shown) that direct an output signal onto one of the vertical segments 126(1), 126(2) or 126(3).

The PLD programming processes and fault tolerance methods discussed below are specifically directed to FPGAs incorporating the general structure described above.

FIG. 2(A) shows a block diagram generally illustrating a system for programming a PROM 150 which subsequently configures an FPGA 100 (see FIG. 2(B)) to operate in accordance with a user's logic operation. The system includes a computer 200 and a programmer 210. The computer 200 has a memory 201 for storing software tools referred to herein as place-and-route software 202 and device programming software 203. The memory 201 also stores a computer-readable FPGA description 204, which identifies all of the interconnect resources and CLBs of the target FPGA 100.

The FPGA programming process typically begins when a user 230 enters a logic operation 205 into memory 201 via an input device 220 (for example, a keyboard, mouse or a floppy disk drive). The user then instructs the place-and-route software 202 to generate configuration data 206 (place-and-route solution) which, when entered into the target FPGA 100, programs the FPGA 100 to implement the logic operation. The place-and-route software begins this process by accessing the FPGA description 204 and the logic operation 205. The place-and-route software 202 then divides the logic operation 205 into inter-related logic portions that can be implemented in the individual CLBs of the target FPGA 100 based on the description provided in the FPGA description 204. The place-and-route software 202 then assigns the logic portions to specific CLBs of the FPGA description 204. Routing data is then generated by identifying specific interconnect resources of the FPGA description 204 that can be linked to form the necessary signal paths between the inter-related logic portions assigned to the CLBs in a manner consistent with the logic operation 205. The placement and routing data is then combined to form configuration data 206. If the place-and-route software 202 fails to generate, for example, a routing solution for the target FPGA 100, then the user may repeat the place-and-route operation using a different FPGA (e.g., one having more interconnect resources). Place-and-route operations and associated software are well known by those in the FPGA field.

After the place-and-route software 202 generates the configuration data 206, the configuration data is loaded into a PROM 150 via the programming software 203 and the programmer 210. After programming, the PROM 150 is connected to the target FPGA 100, as shown in FIG. 2(B). When power is subsequently applied to the target FPGA 100, the configuration logic of the FPGA 100 reads the configuration data from PROM 150, thereby configuring the FPGA 100 to implement the logic operation.

Fault tolerance in FPGAs is desirable for FPGA manufacturers because it typically increases the yield of usable FPGAs.

One approach to providing fault tolerance in FPGAs is to relocate the logic portion assigned to a defective CLB into a spare or other unused CLB, and to reroute signals from the defective CLB to the spare/unused CLB. A problem with this approach is that a user typically does not know which CLB of a particular FPGA will be defective, and usually generates configuration data intended for a defect-free device. If the user then attempts to program an FPGA 100 containing a defective CLB, the programmed FPGA will not perform as intended. Therefore, the user must either discard the FPGA, or the user must repeat the place-and-route process with a modified device description indicating the location of the defective CLB. In other words, the user must generate new configuration data that does not assign a logic portion to the defective CLB. Because each target FPGA may have a defective CLB in a different location, this approach potentially requires different configuration data for every device implementing the user's logic operation. This approach puts a heavy burden on the user who must potentially repeat the place-and-route operation for each FPGA and supply many PROM configurations.

A second approach to providing fault tolerance in FPGAs is disclosed in U.S. Pat. No. 5,434,514 (Cliff et al.). According to this approach, a spare group (row or column) of CLBs and associated interconnect resources is provided in an FPGA for use if the FPGA contains a defective CLB. This approach makes fault tolerance transparent to the user by also providing extra wiring and factory-configured switches on the interconnect lines to direct signals around the row containing the faulty CLB while maintaining the same logical routing configuration. To reconfigure around a row containing a faulty logic element, fuses are burned at the factory that shift connections from the faulty row to an adjacent non-faulty row, whose connections are also shifted, and so on until the spare row is utilized. A problem with this approach is that, for the faulty row to be transparent (i.e., capable of utilizing the user's "fault-free device" configuration data), it is necessary to maintain the original connectivity between the rows on either side of the faulty row. This connectivity requires extra wiring resources that greatly increase the area overhead of the FPGA, thereby making this solution undesirable.

A third approach to implementing redundant circuitry in an FPGA is taught in "Node-Covering Based Defect and Fault Tolerance Methods for Increased Yield in FPGAs", by Fran Hanchek and Shantanu Dutt, Proceedings of the Ninth International Conference on VLSI Design, January 1996. This approach utilizes the principle of "node-covering" that, unlike the first and second approaches, is implemented in the place-and-route software and the device programming software. That is, during the place-and-route process each primary CLB (node) in the FPGA is assigned a cover (i.e., replacement) CLB that can be reconfigured to replace the primary CLB if the primary CLB is defective in a particular target FPGA. The cover CLB of a particular primary CLB may be an unused CLB or another primary CLB, thereby forming a chain of primary/cover CLBs. A spare row (or column) of CLBs is provided for covering the last primary CLB in the row (or column). FPGA routing software 202 reserves the segments 121 required to complete routes to the covering CLBs, thereby avoiding the need to connect all CLBs identically. If a defective primary CLB is identified in a target FPGA, the target FPGA can be reconfigured by the device programming software using a simple process such that the defective CLB is replaced by its cover CLB, which in turn is replaced by its own cover, and so on until a spare CLB in the chain is reached. The reserved segments are used to connect segments to the covering CLBs.

For a given FPGA, placement and routing solutions obtained by the node-covering method are able to tolerate one faulty CLB in each row. In order for a cover CLB to replace a primary CLB, two conditions must be met. First, the cover CLB must be able to duplicate the functionality of the primary CLB. This is easy in a typical FPGA, because all of the CLBs are identical. Configuration data designated for the primary CLB is simply transposed to the cover CLB. Second, the cover CLB must be able to duplicate the connectivity of the primary CLB with respect to the rest of the CLBs. This requires that the associated routing solution reserve certain interconnect line segments for maintaining the signal paths when configuration data is shifted from a defective primary CLB to its cover CLB along the row. This concept is better understood with reference to FIG. 1(A), in which CLB-4 and CLB-8 are designated as spare CLBs in their respective rows. The segment-to-CLB connections are associated with the CLB configurations. Therefore, when primary CLB configuration data is transposed to a cover CLB, all of the segment-to-CLB connection data is transposed as well.

FIGS. 3(A) and 3(B) illustrate the fault tolerance method utilizing this node-covering principle.

FIG. 3(A) is a graphic representation showing a primary configuration in which CLB configuration data portions A through H are respectively stored in primary CLBs CLB-1 through CLB-4, and CLB-6 through CLB-9. No configuration data is stored in CLB-5 and CLB-10, which are reserved as "spare" CLBs. Each CLB is "covered" by an immediately adjacent CLB. Specifically, CLB-1 through CLB-4 are respectively covered by CLB-2 through CLB-5, and CLB-6 through CLB-9 are respectively covered by CLB-7 through CLB-10.

FIG. 3(B) shows an alternative configuration in which CLB-1 and/or CLB-6 is defective. CLB configuration data portions A through H are shifted to the "cover" CLBs (CLB-2 through CLB-5 and CLB-7 through CLB-10) to avoid two defective primary CLBs (CLB-1 and CLB-6). To meet the connectivity requirement, each signal path programmably coupled to a primary CLB through a primary segment must also include a corresponding cover segment for transmitting signals to the cover CLB. Cover segments are incorporated into the routing solution in one of two ways. First, cover segments may be adjacent primary segments associated with adjacent primary CLBs. For example, as shown in FIG. 3(A), primary segment 121(1) programmably coupled to CLB-1 is covered by primary segment 121(2) programmably coupled to CLB-2. Alternatively, additional reserved segments are incorporated into the routing solution. For example, the primary segment 121(2) programmably coupled to CLB-2 is covered by reserved segment 121(3) (indicated by a broken line) that is programmably coupled to CLB-3. Therefore, with fault tolerant CLB groups defined along rows, covering a segment-to-CLB connection to a horizontal interconnect segment requires one reserved segment.

A problem associated with the spare node method is that the reserved segments constitute unusable portions of the FPGA in the primary routing solution, thereby reducing the effective size of the FPGA. Hanchek and Dutt (supra) estimate this overhead to be approximately 30%. In effect, a routing solution in accordance with the spare node method that "fully" utilizes the interconnect resources of an FPGA actually uses only 70% of the available interconnect segments. As a result, some logic operations that would otherwise route on a particular FPGA using conventional routing methods may not route using the spare node method. When this occurs, a user must either utilize a "normal" place-and-route process (which then precludes fault tolerance), or purchase a larger (and typically more expensive) FPGA to implement the user-defined logic operation.

A second problem with the spare node solution is the signal delay caused when signals pass through the additional segment-to-segment switches when a spare segment is utilized. For example, configuration data B is placed in CLB-2 in the primary placement solution (FIG. 3(A)), and is relocated in CLB-3 in the alternative solution (FIG. 3(B)) if CLB-1 is defective. Referring to FIG. 3(A), a signal passed along the primary signal path from segment 121(1) to segment 121(2) to CLB-2 encounters a switching delay caused by segment-to-segment switch 122(1). However, in the alternative solution, the same signal directed to CLB-3 must pass through a second segment-to-segment switch 122(2) before reaching segment 121(3), thereby changing the timing specification of the signal path. This delay may cause problems in an actual FPGA if the timing specifications for a particular logic function are particularly tight. Further, in practice, an FPGA vendor can only guarantee the slower timing of the alternative solution, thereby making the FPGA appear slower to customers.

Therefore, a need arises for a fault tolerance method that requires little overhead, and provides good guaranteed performance.

SUMMARY OF THE INVENTION

The present invention is directed to a fault tolerance method utilized in FPGAs that have elongated wiring segments that are programmably coupled to two (or more) CLBs arranged in a row. The fault tolerance method applies special routing constraints that allow logic to be shifted from a defective CLB to an adjacent non-defective CLB that is connected to the same wiring segment. Because the signal delay to any point on a wiring segment is essentially identical, the wiring segment routes signals to the non-defective CLB without introducing an additional timing delay. That is, the timing specification for the originally generated routing solution is essentially identical to that of the shifted routing solution. Therefore, the fault tolerance method of the present invention allows an FPGA vendor to guarantee the timing of the original routing solution, thereby making the FPGA more attractive to customers.

In accordance with a first embodiment of the present invention, a reserved segment is assigned to each CLB in accordance with the relative position of the CLB along the segment. For example, if a CLB is connected to the rightmost end of a segment, then that segment is the reserved segment for that CLB. This assignment allows subsequent shifting of logic in the rightward direction without requiring a signal path to include an additional segment-to-segment connection switch. The fault tolerance method is particularly useful when applied in accordance with FPGAs having staggered segment arrangements. In a staggered segment arrangement, although a wiring segment may be reserved with respect to a first CLB, it is not reserved with respect to a second CLB located adjacent to the first CLB. Therefore, the wiring segment may be used to route signals to the second CLB. As such, very little overhead is required to implement the fault tolerance method of the present invention.

In accordance with the first embodiment, the fault tolerance method is incorporated into place and route software used to generate configuration data for configuring an actual FPGA in accordance with a user's logic operation. The place-and-route software divides the user-defined logic operation into inter-related logic portions that can be implemented in the individual CLBs of a target FPGA. The place-and-route software then assigns (places) the logic portions to specific CLBs identified in the FPGA description. Reserved segments associated with the CLBs to which logic portions are assigned are then identified. The reserved segments are designated according to the location of a spare column (or row) of CLBs on the FPGA. A routing process is then performed in which signal paths connecting the CLBs are routed such that each signal path that transmits a signal to or from a CLB is assigned to any segment other than the reserved segment associated with the CLB.

In accordance with a second embodiment, the fault tolerance method is incorporated into place and route software used to generate configuration data for configuring an actual FPGA in accordance with a user's logic operation. The place-and-route software divides the user-defined logic operation into inter-related logic portions that can be implemented in the individual CLBs of a target FPGA. The place-and-route software then assigns (places) the logic portions to specific CLBs identified in the FPGA description. Signal paths between the logic portions are then routed using only non-reserved connection switches. That is, the reserved connection switches associated with each horizontal segment are not included in a list of available interconnect resources. In effect, the routing process is performed as if these reserved connection switches do not exist. Because the reserved connection switches are removed from the list of available resources, any known routing method may be used to route the signal paths. That is, by removing the reserved connection switches, the routing software is forced to find a routing solution that meets the criteria associated with the fault tolerance method of the second embodiment.

In accordance with the second embodiment of the present invention, each horizontal segment includes pre-designated reserved connection switches that programmably couple the horizontal segment to a specific vertical channel and to a specific CLB. The reserved connection switches of a horizontal segment are adjacent to an end of the segment that is located closest to a spare column of CLBs. For example, if a spare CLB is connected to the rightmost end of a segment, then connection switches programmably coupling that segment to the spare CLB are reserved. In addition, connection switches that programmably couple the horizontal segment to the vertical segments of the rightmost vertical channel are also reserved. This assignment allows subsequent shifting of configuration data, including connection switch data, in the rightward direction along the segment without requiring a signal path to pass through an additional segment-to-segment connection switch.

In the fault tolerance methods of both the first and second embodiments, the configuration data generated by the place-and-route software is then utilized to configure a target FPGA. If the actual CLB is a defective CLB, the fault tolerance methods of the first and second embodiments allow the logic portion assigned to the defective CLB to be shifted to an adjacent CLB without changing the timing specification of the signal path.

BRIEF DESCRIPTION OF THE DRAWINGS

FIG. 1(A) is a diagram showing a portion of simplified prior art FPGA.

FIGS. 1(B), 1(C) and 1(D) are diagrams showing switching structures utilized in the FPGA of FIG. 1(A).

FIGS. 3(A) and 3(B) are diagrams illustrating a prior art fault tolerance method.

DETAILED DESCRIPTION OF THE DRAWINGS

Figure 4A:
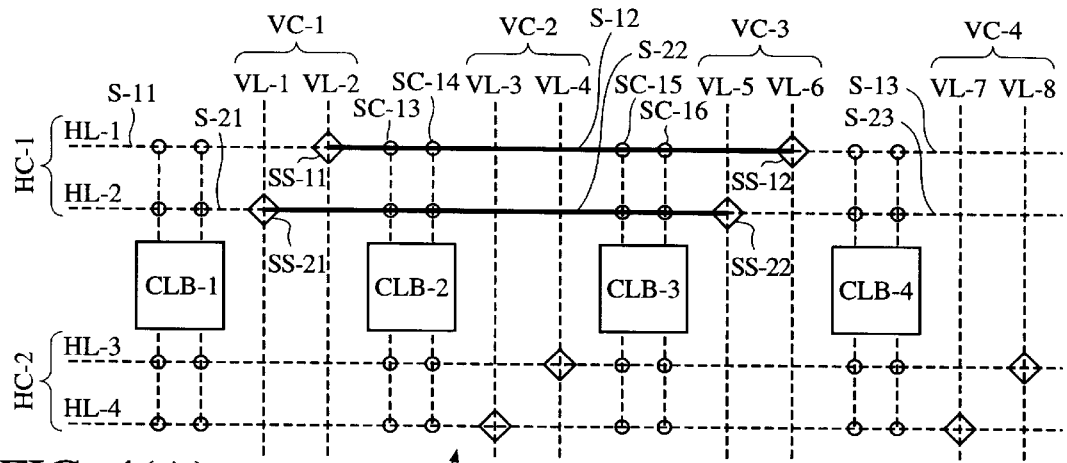
FIGS. 4(A), 4(B) and 4(C) are diagrams illustrating simplified FPGAs having elongated wiring segments.
Figure 4B:
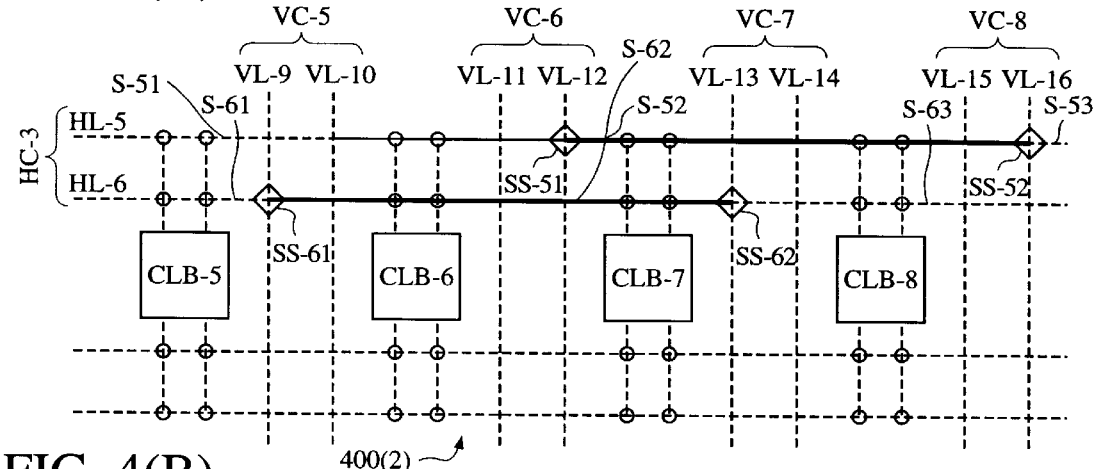
Figure 4C:
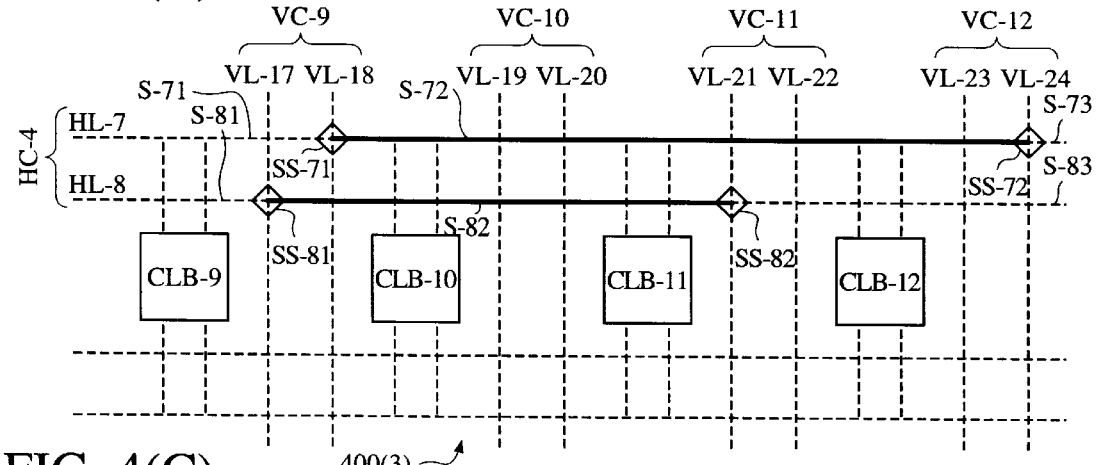

FIGS. 4(A) through 4(C) respectively show examples of simplified FPGAs 400(1), 400(2) and 400(3) (collectively referred to as FPGA 400) to which the present invention is directed.

FPGA 400(1) includes an array of configurable logic blocks (CLBs), of which a portion of one row including CLB-1 through CLB-4 is shown. Similar to typical FPGAs, each CLB includes identical programmable combinational circuitry and optional output registers. In one embodiment, the programmable combinational circuitry of each CLB is identical to that provided in The Programmable Logic Data Book, published by Xilinx, Inc. (Version 1.02, 1996) on pages 4–11 through 4–23 (incorporated herein by reference).

FPGA 400(1) also includes interconnect wiring resources consisting of horizontal interconnect lines HL-1 through HL-4, vertical interconnect lines VL-1 through VL-8 and associated segment-to-segment and segment-to-CLB connection switches. Each interconnect line includes one or more continuous wiring segments which extend between programmable segment-to-segment (SS) connection switches (indicated by diamonds). For example, horizontal line HL-1 includes segments S-11 and S-12 (which is darkened for easy identification) that are programmably coupled by switch SS-11. Similarly, segment S-12 is programmably coupled to segment S-13 by switch SS-12. In one embodiment, each segment-to-segment switch is implemented by the switch structure shown in FIG. 1(B). Each wiring segment is also programmably coupled to two or more CLBs through programmable segment-to-CLB (SC) connection switches (indicated by circles). For example, segment S-12 is programmably coupled to CLB-2 through switches SC-13 and SC-14, and is also programmably coupled to CLB-3 through switches SC-15 and SC-16. Connection switches are also provided between the CLBs and the segments of the horizontal lines HL-3 and HL-4.

The term "channel" is used herein to indicate a collection of parallel interconnect lines located between two rows or two columns of CLBs. For example, referring to FIG. 4(A), horizontal lines HL-1 and HL-2 are part of horizontal channel HC-1, and horizontal lines HL-3 and HL-4 are part of horizontal channel HC-2. Likewise, vertical lines VL-1 and VL-2 are part of vertical channel VC-1.

FPGA 400 differs from prior art FPGA 100 of FIG. 1(A) in that each FPGA 400 includes elongated wiring segments. The phrase "elongated wiring segment" is used herein to refer to a segment of an interconnect line that is formed from a continuous wire (conductor) which is connected to two or more CLBs in a row (or column). For example, referring to FIG. 4(A), segment S-12 extends from switch SS-11, which is located to the left of CLB-2, to switch SS-12, which is located to the right of CLB-3, and is programmably coupled to CLB-2 and CLB-3 through switches SC-13, SC-14, SC-15 and SC-16. Therefore, according to the definition established herein, segment S-12 is an elongated segment.

As shown in FIGS. 4(A), 4(B) and 4(C), the elongated segments of FPGA 400 may have a "coincident segment arrangement" or a "staggered segment arrangement", and may have equal or unequal segment lengths. The meaning of these terms is provided in the following paragraphs.

Referring to FIG. 4(A), FPGA 400(1) includes equal length segments having a coincident segment arrangement. Specifically, FPGA 400(1) includes segments S-12 and S-22 having a common length (i.e., each spans two CLBs). The phrase "coincident segment arrangement" is used herein to describe either segments extending between common channels, or segments which are programmably coupled to common CLBs. Segments S-12 and S-22 of FPGA 400(1) meet both definitions in that these segments extend between channels VC-1 and VC-3, and are programmably coupled to the same CLBs (i.e., CLB-2 and CLB-3).

Referring to FIG. 4(B), FPGA 400(2) includes equal length segments that are in a staggered segment arrangement. The phrase "staggered segment arrangement" is used herein to describe, for example, two segments of a horizontal channel that have ends programmably coupled to different vertical channels. For example, channel HC-3 includes interconnect lines HL-5 and HL-6 that respectively include segments S-51 through S-53 and S-61 through S-63. Segment S-52 extends between switches SS-51 and SS-52, which are respectively programmably coupled to vertical line VL-12 of vertical channel VC-6 and vertical line VL-16 of vertical channel VC-8. In contrast, segment S-62 of adjacent horizontal line HL-6 extends between switches SS-61 and SS-62, which are respectively programmably coupled to vertical line VL-9 of vertical channel VC-5 and VL-13 of vertical channel VC-7. Therefore, a staggered segment arrangement exists between segments S-52 and S-62 because their respective ends are offset by one vertical channel. It is noted that staggered segments S-52 and S-62 are connected to a common CLB (CLB-7).

Referring to FIG. 4(C), FPGA 400(3) illustrates an example of an FPGA 400(3) including segments having unequal lengths. Specifically, segment S-72 spans three CLBs (CLB-10, CLB-11 and CLB-12), while segment S-82 spans only two CLBs (CLB-10 and CLB-1l). Although segments spanning two and three CLBs are shown, the present method may be applied to FPGAs having segment lengths of four or more CLBs.

As used herein, the phrase "programmably coupled" indicates only direct connection between two elements or nodes through a single programmable switch (e.g., through one of the segment-to-segment switches shown in FIG. 1(B), through one of the segment-to-CLB switches shown in FIG. 1(C), or through a comparable switching circuit). In contrast, the phrase "selectively connectable" is used herein to generally indicate programmable connection through one or more programmable switches. For example, the phrase "a first segment and a second segment are programmably coupled" should be interpreted as the first segment is directly connected to the second segment through a single segment-to-segment switch. In contrast, the phrase "a first segment and a second segment are selectively connectable" should be interpreted as the first segment is either directly connected to the second segment through a single segment-to-segment switch, or indirectly connectable to the second segment through two or more switches with at least one segment or one CLB located in the signal path separating the first and second segments.

The present invention is directed to a fault tolerance method utilized in FPGAs having elongated wiring segments, such as FPGA 400 (FIGS. 4(A), 4(B) and 4(C)). Although the fault tolerance method is described below with reference to FPGAs having staggered segment arrangements (such as those shown in FIG. 4(B)), the fault tolerance method may be beneficially utilized in FPGAs having coincident segment arrangements or unequal lengths. Therefore, the appended claims should not be limited to such FPGAs (unless such a limitation is recited).

Figure 2A:
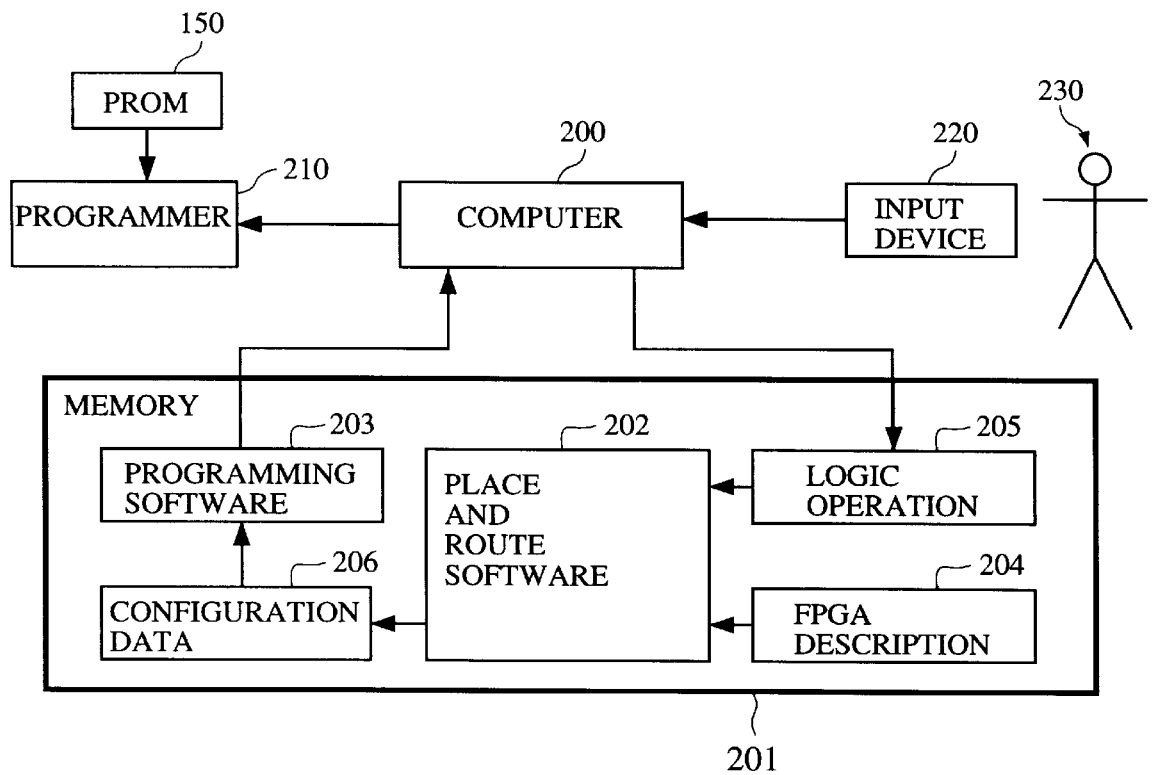
FIG. 2(A) shows a block diagram illustrating a system utilized to program an FPGA.
Figure 2B:
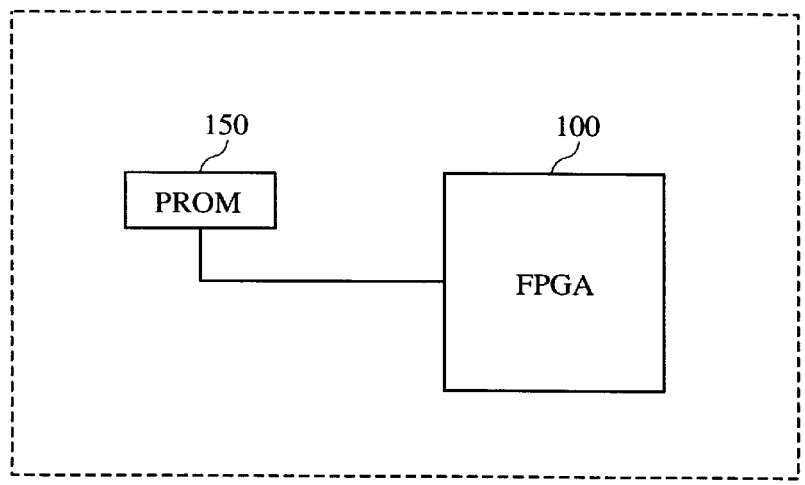
FIG. 2(B) shows a system including an FPGA and a PROM used to store configuration data for the FPGA.

The fault tolerance method of the present invention is incorporated into place and route software and device configuration logic in the manner described below, and is utilized in a system similar to that shown in FIG. 2.

Figure 5:
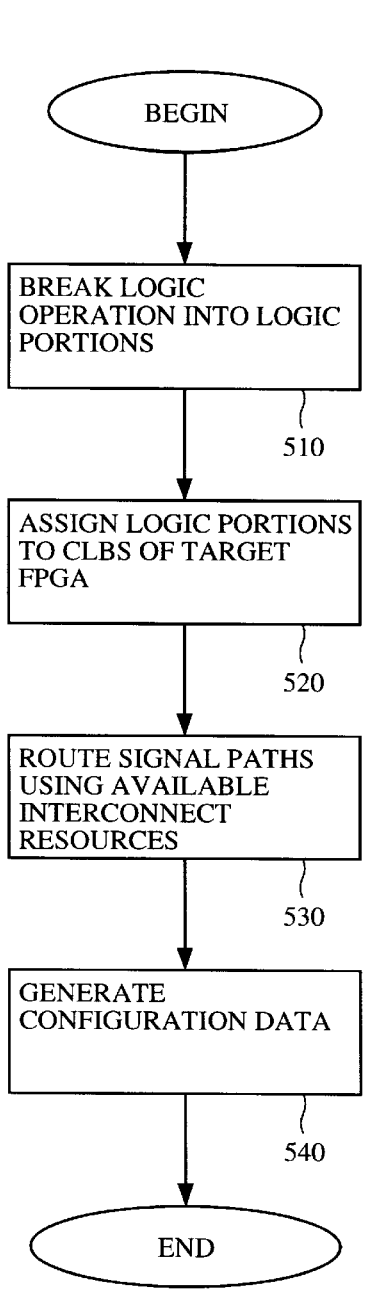
FIG. 5 is a flow diagram showing the basic steps associated with a place-and-route operation in accordance with the present invention.

FIG. 5 is a flowchart illustrating the basic steps associated with a place-and-route process incorporating a fault tolerance method of the present invention. As in prior art processes, the place-and-route software begins by accessing a computer-readable FPGA description and a description of the user-defined logic operation, and then divides the user-defined logic operation into inter-related logic portions that can be implemented in the individual CLBs of the target FPGA 400 (Step 510). The place-and-route software then assigns (places) the logic portions to specific CLBs identified in the FPGA description (Step 520). A routing process is then performed in which signal paths connecting the CLBs are routed (i.e., the place-and-route software identifies specific interconnect resources from the FPGA description that form the necessary signal paths while meeting specified routing constraints) (Step 530). The placement and routing data is then combined to form configuration data (Step 540) that is utilized to configure an actual FPGA device. In the disclosed embodiments described below, place-and-route steps 510, 520 and 540 are implemented using methods well known by those in the FPGA field.

In accordance with a first embodiment of the present invention, the routing process of Step 530 generates a routing solution such that each signal path that transmits a signal to or from a CLB is assigned to any segment other than the reserved segment associated with the CLB. The reserved segments are designated according to the location of a spare column (or row) of CLBs on the FPGA. For example, if the spare CLB in a row of CLBs is located at the "right" end of the row, then the reserved segment associated with a CLB is characterized in that the CLB is connected at the right end of the reserved segment. Conversely, if the spare CLB is located at the "left" end of the row, then each CLB is connected at the left end of its associated reserved segment. The designation of reserved segments is further illustrated with reference to FIG. 4(B). FPGA 400(2) has a staggered segment arrangement in which each segment (e.g., segment S-62) is programmably coupled to two CLBs (i.e., CLB-6 and CLB-7) that are aligned in the row including CLB-5 through CLB-8. Conversely, each CLB (e.g., CLB-7) in the row is programmably coupled to two segments (i.e., segments S-52 and S-62). Assuming that CLB-8 is the spare CLB of the row, the reserved segment associated with CLB-7 is segment S-62 because the end of segment S-62 closest to CLB-8 (i.e., the right end) is programmably coupled to CLB-7. In another embodiment, assuming CLB-5 is the spare CLB of the row, the reserved segment associated with CLB-7 is segment S-52 because the end of segment S-52 closest to CLB-5 (i.e., the left end) is programmably coupled to CLB-7. As used herein, the terms "right", "left", "horizontal", "vertical", "row" and "column" are only used to illustrate particular orientations, and are not intended to limit the appended claims.

As mentioned above, during the routing process each signal path to or from a CLB is assigned to any segment other than the reserved segment associated with the CLB. For example, referring again to FIG. 4(B) and assuming CLB-8 is a spare CLB, a signal path transmitting signals to CLB-7 along horizontal column HC-3 is restricted to use segment S-52 (i.e., S-62 is reserved with respect to CLB-7). In other words, the reserved segment (S-62) of a particular CLB (CLB-7) is not used to route signals to that CLB in the routing solution.

It is noted that the reserved segment of one CLB may not be reserved with respect to an adjacent CLB. For example, although segment S-62 is reserved with respect to CLB-7, it may be used to transmit signals to CLB-6 because CLB-6 is connected to the left end of segment S-62. Therefore, although a reserved segment may not be used to route signals to a particular CLB, that segment is not an unusable portion of the interconnect structure, as in the prior art fault tolerance method proposed by Hanchek and Dutt (discussed above). It is also noted that an actual FPGA typically includes several interconnect lines per routing channel, and the segments may have lengths extending more than two CLBs. By increasing the number of lines and segment lengths, it is possible to greatly minimize overhead associated with the fault tolerance method in accordance with the present invention.

When reserved segments are not used in the routing solution, then fault tolerance is easily implemented by shifting configuration logic from a faulty CLB to an adjacent CLB in the same row (or column). As described in additional detail below, this shifting process is implemented merely by shifting the logic portion assigned to a defective CLB to an adjacent CLB in the same row, and changing the segment-to-CLB connections of each segment to provide connections to the newly-assigned CLBs. That is, the assigned interconnect wiring resources are not changed in the alternative routing solution. Instead, only the segment-to-CLB connections are changed for some of the assigned segments such that signals are routed to the adjacent CLB into which the logic portion is shifted. Because the signals travel on the same interconnect resources, the signals do not have to pass through additional switch points. Therefore, the alternative routing solution has substantially the same timing specification as the original (primary) routing solution. This promotes reliable speed path estimates, and allows the FPGA vendor to guarantee the timing of the both the original and the alternative solutions, thereby making the FPGA appear faster to customers.

Figure 6:
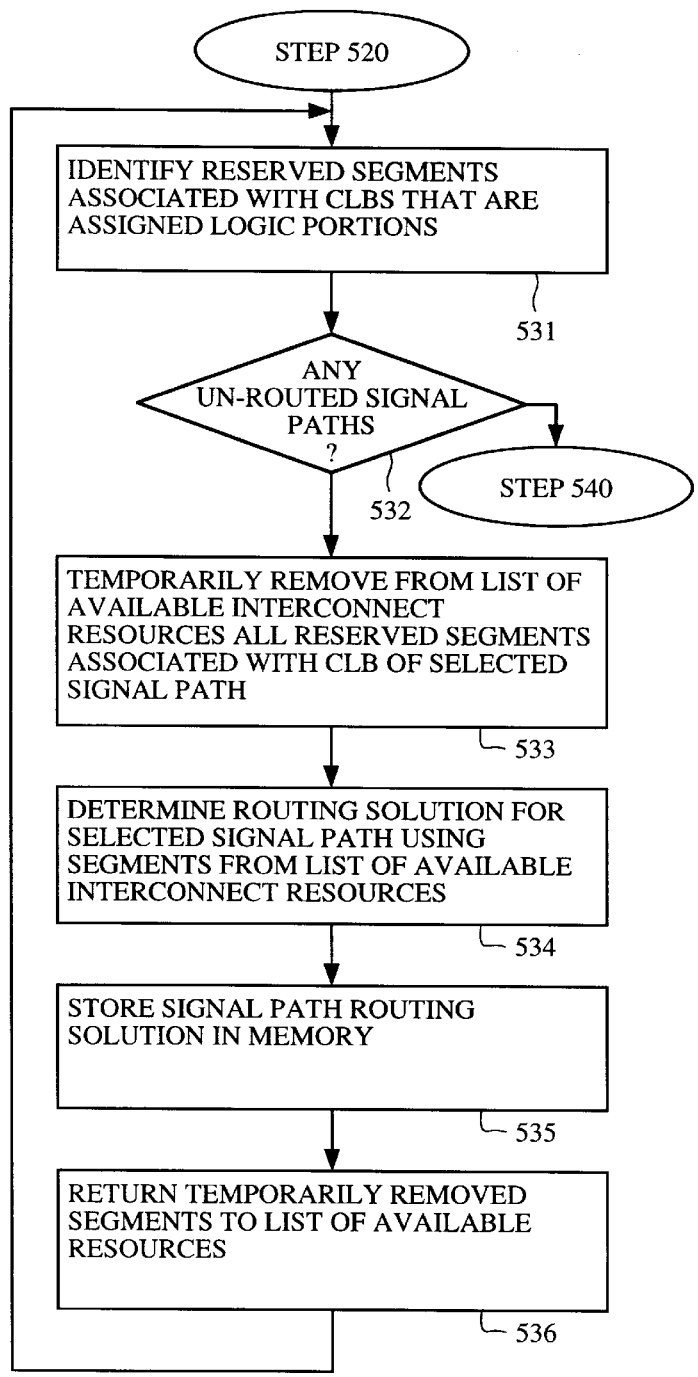
FIG. 6 is a flow diagram showing the steps associated with a routing process in accordance with a first embodiment of the present invention.

FIG. 6 illustrates the routing process implemented in Step 530 of the place-and-route process shown in FIG. 5 in accordance with the first embodiment of the present invention. Although the first embodiment shown in FIG. 6 is described in the form of a "WHILE DO" loop, those skilled in the art will recognize that the routing process can be implemented using other techniques without departing from the novel aspects of the present invention.

Referring to FIG. 6, the routing process is initiated following the placing process (Step 520). At this point in the place-and-route process, logic portions have been assigned to the array of CLBs of the target FPGA 400, but signal paths connecting the logic portions have not been assigned to the interconnect resources. The routing process begins by identifying all reserved segments associated with the CLBs that are assigned logic portions (Step 531). The routing process then checks for un-routed signal paths of the user's logic operation, and a signal path is selected from the identified un-routed signal paths (Step 532). Next, the reserved segments associated with CLBs connected by the signal path are temporarily removed from a list of available interconnect resources (Step 533). A set of interconnect resources (e.g., wiring segments) is then assigned to the signal path from the list of available interconnect resources (Step 534). In this embodiment, the routing process in Step 534 is implemented using known techniques for routing FPGAs that assign a set of interconnect resources that minimize signal delays or resource usage associated with the signal paths. Once an acceptable routing solution is found for the selected signal path, control passes to Step 535 in which the routing solution is stored in memory, and the segments assigned to the signal path are permanently removed from the list of available resources. Next, in Step 536, any reserved segments that were temporarily removed from the list of available interconnect resources in Step 533 are returned to the list of available interconnect resources for possible assignment to subsequently routed signal paths. Finally, control is returned to Step 532 for selection of another un-routed signal path, and, when all signal paths of the user's logic operation have been routed, control is passed to Step 540.

Figure 7A:
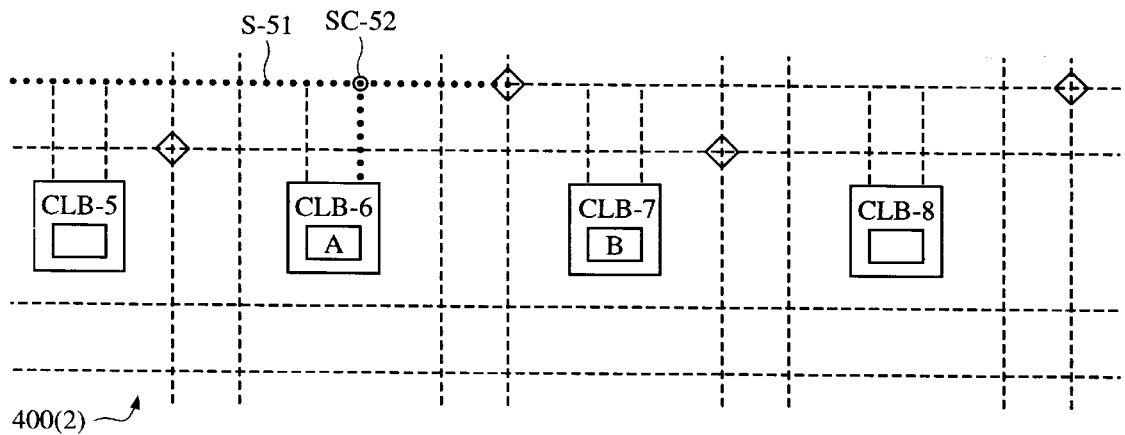
FIGS. 7(A), 7(B) and 7(C) are diagrams illustrating the routing process in accordance with the first embodiment.
Figure 7B:
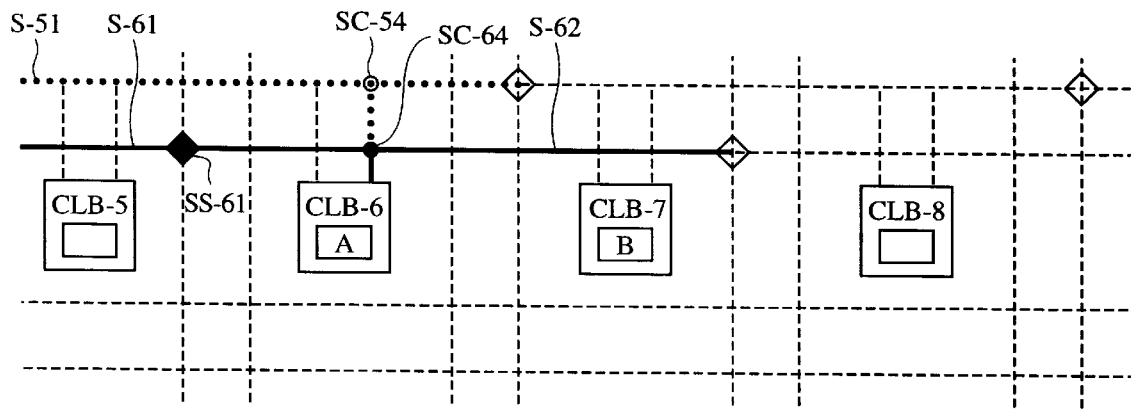
Figure 7C:
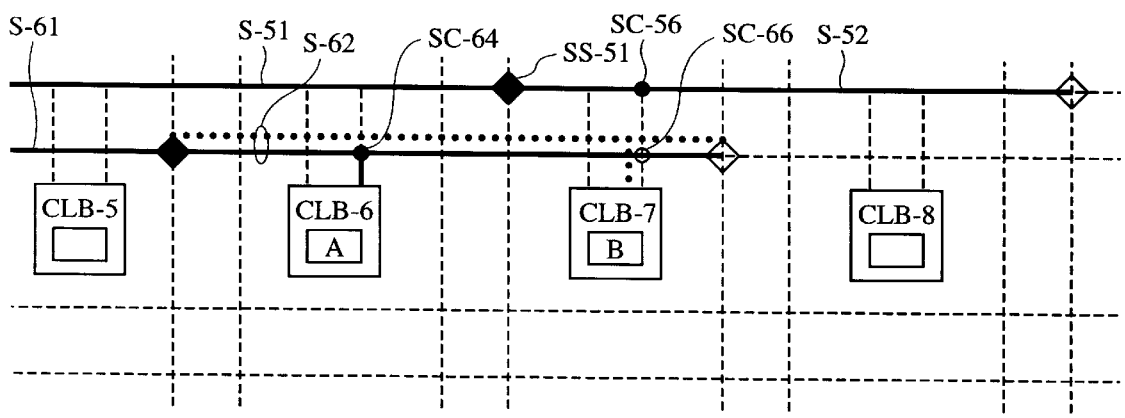

FIGS. 7(A), 7(B) and 7(C) illustrate an example of the routing process of FIG. 6. These figures show a graphic representation of CLB and interconnect resources associated with one row of a stored description of a target FPGA that is consistent with FPGA 400(2) shown in FIG. 4(B). The row of CLBs (CLB-5 through CLB-8) are understood to be part of a larger array of CLBs arranged in rows and columns, and a column of spare CLBs is aligned along a right edge of the array and includes CLB-8. Similarly, the interconnect resources shown in these figures are understood to be part of a larger network of interconnect resources including vertical and horizontal channels of interconnect lines passing between the CLBs of the array. The example assumes that logic portions A and B are assigned to CLB-6 and CLB-7, respectively, in the placement process of Step 520 (see FIG. 5). Logic portions A and B are typically associated to other logic portions of the user's logic operation via signal paths originally stored in the un-routed signal path list. To simplify the description of the following example, only one signal path to each logic portion will be considered (in practical examples, several inputs and outputs to each CLB are typical).

FIG. 7(A) shows an example of the routing process for the signal path to logic portion A. Because the signal path to logic portion A requires connection to CLB-6, the reserved segment (i.e., segment S-51) associated with CLB-6 is temporarily removed from the list of available resources (see Step 533 in FIG. 6). The temporary removal of the reserved segment is indicated by the dotted line located on horizontal segment S-51, and the dotted connection from segment-to-CLB switch SC-52 to CLB-6. FIG. 7(B) shows that with segment S-51 temporarily removed from the list of available resources, the routing software is forced to route the signal path on segment S-62 through segment-to-CLB switch SC-64 (Step 534 in FIG. 6). The routing software also assigns the signal path to other interconnect resources, such as segment S-61 and segment-to-segment switch SS-61 in order to complete the required connection associated with the signal path. After the routing software completely routes the signal path, the signal path routing solution is stored in memory (Step 535). Subsequently, reserved segment S-52 is returned to the list of available resources (Step 536), and control passes back to Step 532 for the selection of another un-routed signal path.

FIG. 7(C) is a diagram showing the subsequent routing process for the signal path connected to logic portion B, which is assigned to CLB-7. The reserved segment associated with CLB-7 is segment S-62, which is already assigned to the signal path connected to logic portion A. Because segment S-62 is already utilized in the signal path to logic portion A, this reserved segment is already permanently removed from the list of available resources, so it is not necessary to temporarily remove this segment in Step 542. With segment S-62 permanently removed from the list of available resources, the routing software is forced to route the signal path on segment S-52 through segment-to-CLB switch SC-56 (Step 534 in FIG. 6). The routing software also assigns the signal path to other interconnect resources, including segment S-51 and segment-to-segment switch SS-51 in order to complete the required selective connection to the signal source of the signal path (not shown). Note that, although segment S-51 is reserved with respect to CLB-6, it is not reserved with respect to CLB-7. This reduces overhead because the use of each reserved segment is only restricted with respect to its associated CLBs, not all CLBs. After the routing software completely routes the signal path, the routing solution associated with the signal path is stored in memory (Step 535).

After the routing process generates a routing solution (Step 530, FIG. 5) and configuration data is generated (Step 540), the configuration data is stored in memory until the user wishes to program an actual FPGA.

Subsequent configuration (programming) of an actual FPGA utilizing the fault tolerant routing solution generated by the place-and-route process shown in FIGS. 5 and 6 will now be discussed. In general, this configuration process typically includes two parts: testing of actual FPGAs by the FPGA manufacturer, and subsequently loading the configuration data into the tested FPGAs.

FPGA manufacturers test their FPGAs in order to prevent the sale of defective FPGAs to their customers. This testing process identifies, for example, defects in the interconnect resources and CLBs that would prevent proper operation of an FPGA. As mentioned above, the present invention is directed to a method that will tolerate one or more defective CLBs in an FPGA without changing the timing specifications of the programmed FPGA. This means that FPGAs having a limited number of CLB defects may be sold to customers as "fault-free" FPGAs. As such, production yields are increased, thereby increasing profits for the FPGA manufacturer.

In accordance with the present invention, if a defective CLB is identified on an actual FPGA during the testing phase, the device manufacturer alters the configuration logic stored on the actual FPGA such that the configuration data associated with the defective CLB is shifted to an adjacent CLB along the row in the direction of the spare CLB of that row. In addition, the altered configuration logic shifts the configuration data assigned to the segment-to-CLB switches associated with the shifted CLB configuration data. Alteration of the configuration logic of an actual FPGA by the FPGA manufacturer occurs before sale of the FPGA to a customer. Therefore, the data shifting process is automatically implemented each time configuration data is loaded into the FPGA, thereby making the fault tolerance method of the present invention transparent to the customers.

In accordance with the present invention, when configuration data is subsequently loaded into an FPGA having altered configuration logic, the configuration logic automatically shifts the configuration data to avoid the defective CLB. Configuration data is typically loaded during an initiation (start-up) process when power is applied to the FPGA. The configuration data is loaded from, for example, an EPROM into the configuration memory of the FPGA in accordance with configuration logic of the FPGA. When the configuration logic is not altered, the configuration data is loaded into the originally assigned CLBs (i.e., the spare CLBs are not utilized). Conversely, when a defective CLB is identified during the testing phase, the configuration logic is altered to shift the configuration data to avoid the defective CLB.

The shifting process performed by the altered configuration logic of an FPGA is described with reference to FIGS. 8(A), 8(B) and 8(C). These figures depict an actual FPGA 800 that is consistent with FPGA 400(2) shown in FIG. 4(B). Therefore, reference numerals identifying portions of FPGA 800 are identical to those used in FIG. 4(B).

Figure 8A:
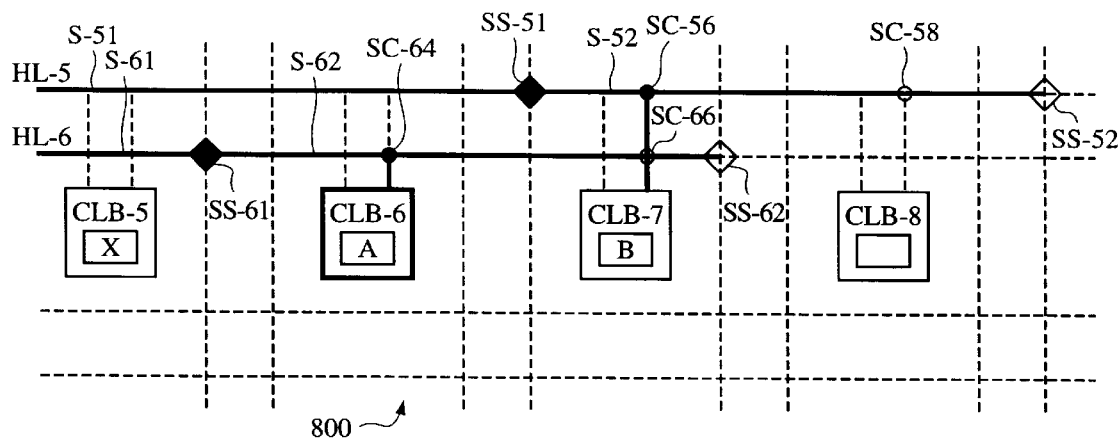
FIGS. 8(A), 8(B) and 8(C) are diagrams illustrating implementation of the fault tolerance method in accordance with the present invention.
Figure 8B:
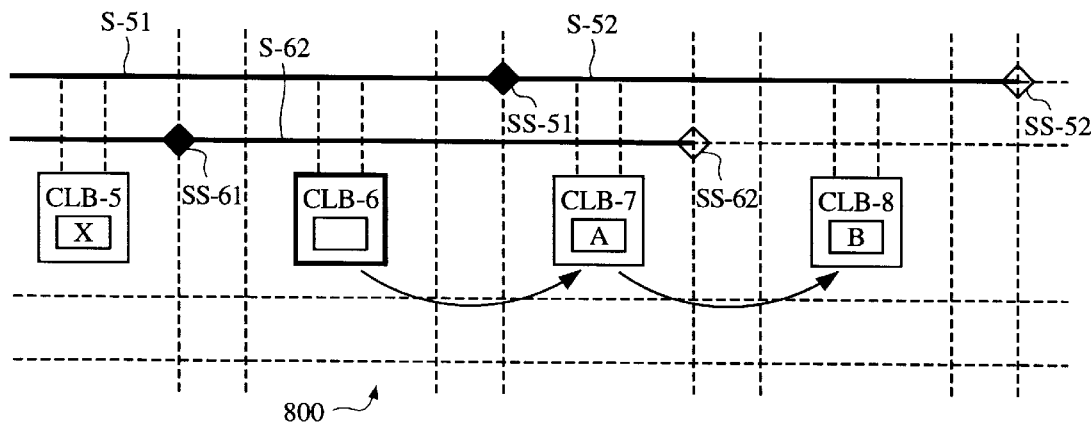

FIGS. 8(A) depicts the original configuration data including assignments of logic portions A and B to CLB-6 and CLB-7, respectively. No logic is assigned to spare CLB-8, and a dummy logic portion X is assigned to CLB-5. The configuration data also includes assignments of interconnect resources associated with signal path transmissions to logic portions A and B. In accordance with this example, it is assumed that the actual FPGA 800 includes defective CLB-6 (indicated with a darkened periphery). Because CLB-6 is defective, FPGA 400(2) will probably fail to implement the user's logic operation if the configuration data is loaded without altering the configuration logic to shift the configuration data as shown in FIGS. 8(B) and 8(C). Specifically, as shown in FIG. 8(B), in accordance with the altered configuration logic of FPGA 800, logic portion A of defective CLB-6 is re-assigned to CLB-7 (that is, logic portion A is shifted along the row in the direction of spare CLB-8 from the defective CLB-6 to the adjacent CLB-7). To accommodate logic portion A, logic portion B is also shifted from CLB-7 to spare CLB-8. Logic portions located in the direction away from the spare CLB (i.e., to the left of defective CLB-6) are not re-assigned. For example, logic portion X assigned to CLB-5 remains in CLB-5.

Figure 8C:
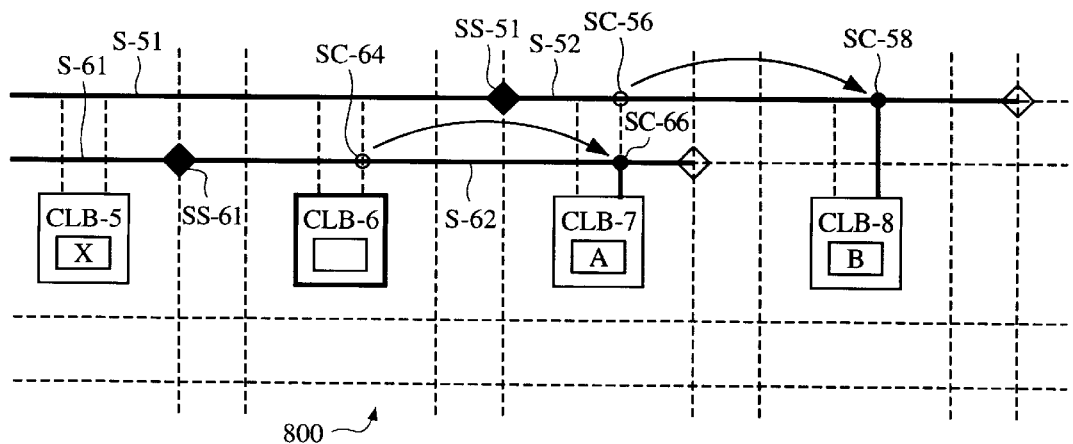

Referring to FIG. 8(C), to match the shifted logic portions, the associated segment-to-CLB connections are also shifted toward spare CLB-8. Specifically, the connection from segment S-52 to logic portion B is shifted from switch SC-56 (connecting to CLB-7) to SC-58 (connecting to CLB-8). Similarly, the connection from segment S-62 to logic portion A is shifted from switch SC-64 (connecting to CLB-6) to SC-66 (connecting to CLB-7).

In the above example, the present invention performs fault tolerance for defective CLBs without introducing additional signal delays because signals are transmitted along the same horizontal segments in both the original configuration data and in the modified configuration data. This additional signal delay can be seen by comparing FIGS. 8(A) and 8(C), where signals to logic portion A are transmitted from segment S-62 through switch SC-64 in FIG. 8(A), and from segment S-62 through switch SC-66 in FIG. 8(C). That is, no additional delay is introduced into the configuration when the fault tolerance method according to the present invention is utilized.

Figure 9:
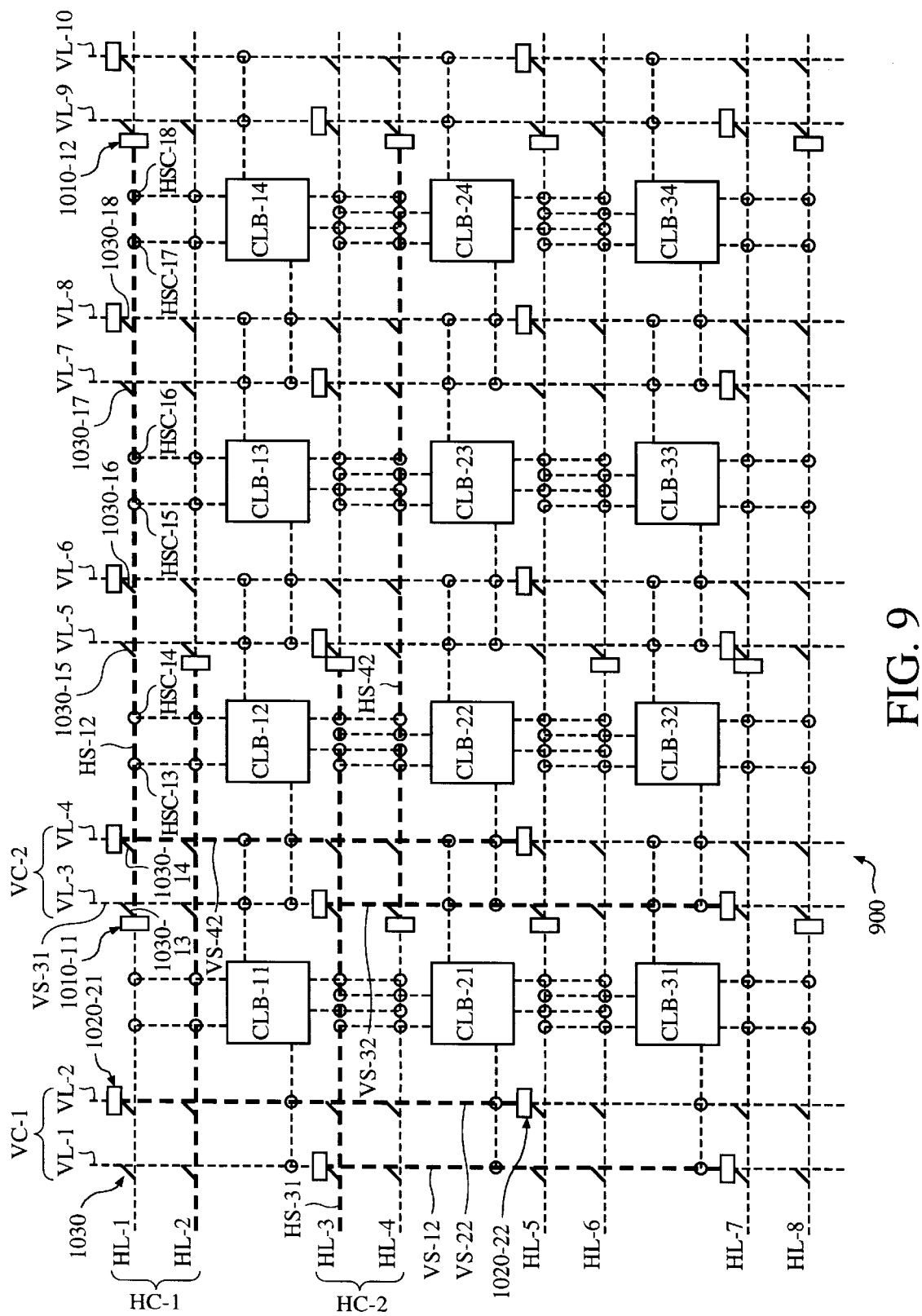
FIG. 9 is a diagram showing a portion of a simplified FPGA associated with a second embodiment of the present invention.

FIG. 9 is a simplified schematic diagram showing a portion of an FPGA 900 in accordance with a second embodiment of the present invention. FPGA 900 includes twelve CLBs arranged in a matrix, and interconnect resources that are programmable to route signals between the CLBs in accordance with a desired logic operation.

The CLBs of FPGA 900 are arranged in three rows, with CLB-11 through CLB-14 forming the top row, CLB-21 through CLB-24 forming the middle row, and CLB-31 through CLB-34 forming the bottom row. Each CLB includes programmable logic elements that are connected to receive input signals through five input terminals located on a peripheral edge of the CLB. Specifically, first and second input terminals are located along the top edge and programmably coupled to a first pair of horizontal segments, third and fourth input terminals are located along the bottom edge and programmably coupled to a second pair of horizontal segments, and a fifth input terminal is located on the left edge and programmably coupled to a first pair of vertical segments. Each input terminal transmits signals from the associated interconnect segment into the CLB via a horizontal segment-to-CLB (HSC) input switch or a vertical segment-to-CLB (VSC) input switch, such as the input switch 123 shown in FIG. 1(C). The CLB also includes an output terminal located on its right edge that is programmably coupled to a second pair of vertical segments. Output signals are transmitted from each CLB to one of the vertical horizontal segment-to-CLB (VSC) output switch, such as the output switch 127 shown in FIG. 1(D).

The interconnect resources of FPGA 900 are similar to those of the first embodiment (discussed above) in that FPGA 900 includes horizontal and vertical channels comprising segmented interconnect lines. Specifically, FPGA 900 includes eight horizontal lines HL-1 through HL-8 arranged in four channels (e.g., lines HL-1 and HL-2 form horizontal channel HC-1, and lines HL-3 and HL-4 form horizontal channel HC-2). Each horizontal line is separated into elongated segments that extend the length of three CLBs. For example, horizontal segment HS-12 extends from the left side of CLB-12 to the right side of CLB-14. FPGA 900 also includes ten vertical lines VL-1 through VL-10 arranged in five channels (e.g., lines VL-1 and VL-2 form vertical channel VC-1, and lines VL-3 and VL-4 form vertical channel VC-2). Each vertical line is separated into elongated segments that extend the length of two CLBs. The length of each elongated horizontal and vertical segment is set arbitrarily in the present example, and may be increased as desired.

Figures 10A, 10B, 10C:
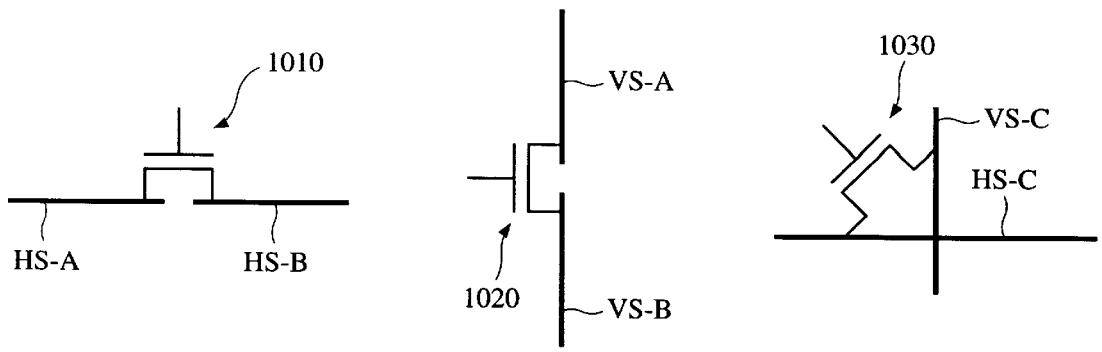
FIGS. 10(A), 10(B) and 10(C) are circuit diagrams illustrating switches of the FPGA shown in FIG. 9.

The interconnect resources of FPGA 900 differ from the first embodiment (discussed above) in the manner in which the segmented lines are programmably coupled. Specifically, the first embodiment utilizes the six-way switches 122 (shown in FIG. 1(B)) that are located at the intersections of the horizontal and vertical channels to provide horizontal-to-horizontal segment connections, vertical-to-vertical segment connections, and horizontal-to-vertical segment connections. In contrast, FPGA 900 includes separate horizontal-to-horizontal segment connection switches 1010, vertical-to-vertical segment connections switches 1020, and horizontal-to-vertical segment connection switches 1030. The horizontal-to-horizontal segment connection switches 1010 are located on each horizontal line between two vertical channels. As shown in FIG. 10(A), each switch 1010 includes a pass transistor controlled by a memory element (not shown) that selectively couples a first horizontal segment HS-A to a second horizontal segment HS-B. The vertical-to-vertical segment connection switches 1020 are located on each vertical line between two horizontal channels. As shown in FIG. 10(B), each switch 1020 includes a pass transistor controlled by a memory element (not shown) that selectively couples a first vertical segment VS-A to a second vertical segment VS-B. Finally, the horizontal-to-vertical segment connection switches 1030 are located at each intersection of a horizontal line and a vertical line. As shown in FIG. 10(C), each switch 1030 includes a pass transistor controlled by a memory element (not shown) that selectively couples a horizontal segment HS-C to a vertical segment VS-C. In addition to the pass transistors, switches 1010, 1020 and 1030 may also include a non-volatile linking element, such as a fuse or an antifuse.

The horizontal segments of FPGA 900 are arranged in a staggered segment arrangement that is alternated from channel to channel, and the vertical segments are arranged in a staggered segment arrangement that is identical from channel to channel. These segment arrangements are shown in FIG. 9 where horizontal segment HS-12 and horizontal segment HS-21 of channel HC-1 (indicated by darkened dashed lines) are in a staggered segment arrangement that is mirrored by horizontal segments HS-31 and HS-42 of channel HC-2. In contrast, vertical segment VS-12 and vertical segment VS-22 of channel VC-1 (indicated by darkened dashed lines) are in a staggered segment arrangement that is repeated by vertical segments VS-32 and VS-42 of channel VC-2. In accordance with the second embodiment, the "mirror" arrangement of the horizontal segments may be changed to an "identical" arrangement. The "identical" arrangement of the vertical segments facilitates shifting of configuration data from one column of CLBs to an adjacent column without introducing changes in the signal delays along vertical lines. This concept will be described in additional detail in the example provided below.

Each horizontal segment of FPGA 900 is assigned one or more reserved horizontal segment-to-CLB switches (HSC), and one or more reserved horizontal-to-vertical switches 1030. The reserved switches of each horizontal segment are determined by their proximity to the end of the horizontal segment relative to the spare column of CLBs of FPGA 900. For example, if CLB-14, CLB-24 and CLB-34 are part of the spare CLB column of FPGA 900, then switches HSC-17 and HSC-18 are the reserved horizontal segment-to-CLB switches in horizontal segment HS-12 because they are located at the right end of that segment (i.e., the end closest to the spare CLB column). Similarly, switches 1030-17 and 1030-18 are the reserved horizontal-to-vertical segment switches associated with horizontal segment HS-12 because these switches connect segment HS-12 to the vertical column located at the right end of that segment (i.e., the end closest to the spare CLB column).

The number of non-reserved connections available on each horizontal segment can be increased by increasing its length. That is, because horizontal segment HS-12 is programmably coupled to three CLBs (CLB-12, CLB-13 and CLB-14), two-thirds of the segment-to-CLB switches (i.e., HSC-13, HSC-14, HSC-15 and HSC-16) are available for routing (i.e., are not reserved). Similarly, because horizontal segment HS-12 is programmably coupled to three vertical channels, two-thirds of the switches 1030 are also available for routing (i.e., are not reserved). By increasing the length of each horizontal segment, the number of non-reserved connection switches on each segment is increased, thereby increasing the likelihood of finding a routing solution in accordance with the fault tolerance methods of the present invention. Of course, segments that extend the length of an FPGA will provide maximum routing solutions, but may not be cost effective for routing signals that are transmitted a short distance.

Figure 11:
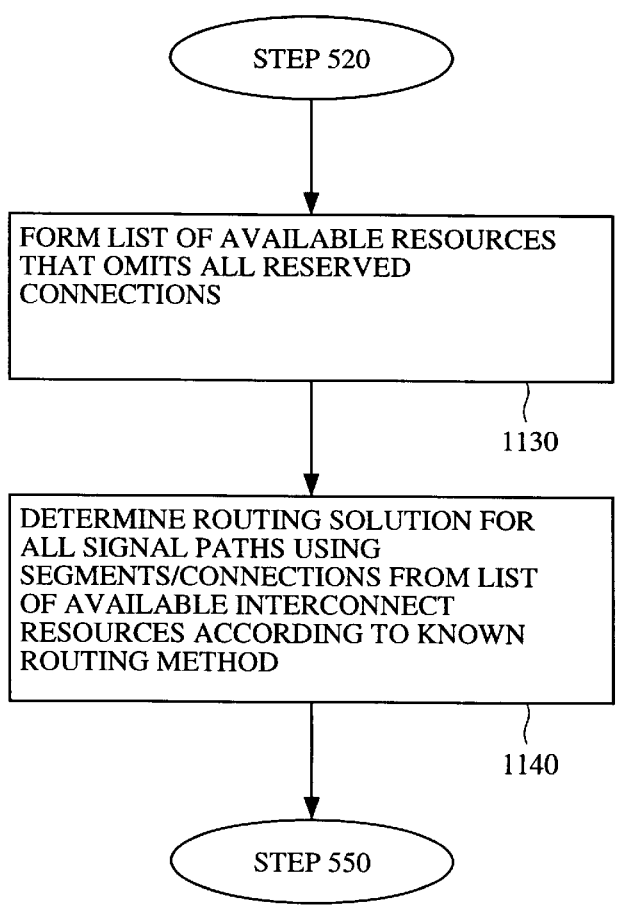
FIG. 11 is a flow diagram showing a routing process according to the second embodiment.

FIG. 11 shows a modified routing process according to the second embodiment that is used in the routing Step 530 of the place-and-route process shown in FIG. 5. The modified routing process utilizes a list of available resources that includes both segment and connection switch information associated with each horizontal and vertical segment. The modified routing process begins by forming a list of available resources wherein all reserved connection switches that are associated with selected segments of a target FPGA are omitted (Step 1130). For example, referring back to FIG. 9, horizontal segment HS-12 is entered into the list of available resources along with horizontal-to-vertical connection switches 1030-13, 1030-14, 1030-15 and 1030-16 (reserved switches 1030-17 and 1030-18 are omitted from the list of available resources). Likewise, segment-to-CLB switches HSC-13, HSC-14, HSC-15 and HSC-16 are entered (reserved switches HSC-17 and HSC-18 are omitted or removed). As a result, when segment HS-12 is subsequently considered for assignment to a signal path, the routing software only recognizes that segment HS-12 includes programmable connections to vertical lines VL-3, VL-4, VL-5 and VL-6 (not VL-7 and VL-8), and programmable connections to CLB-12 and CLB-13 (not CLB-14). Consequently, the routing software cannot route signal paths on segment HS-12 using reserved switches 1030-17, 1030-18, HSC-17 and HSC-18. Next, in Step 1140, any of the known routing methods is implemented to route the signal paths associated with the user's logic operation. That is, once the list of available resources is modified as set forth in step 1130, routing may proceed using known routing techniques. Finally, control is passed to Step 540 (FIG. 5).

Figure 12A:
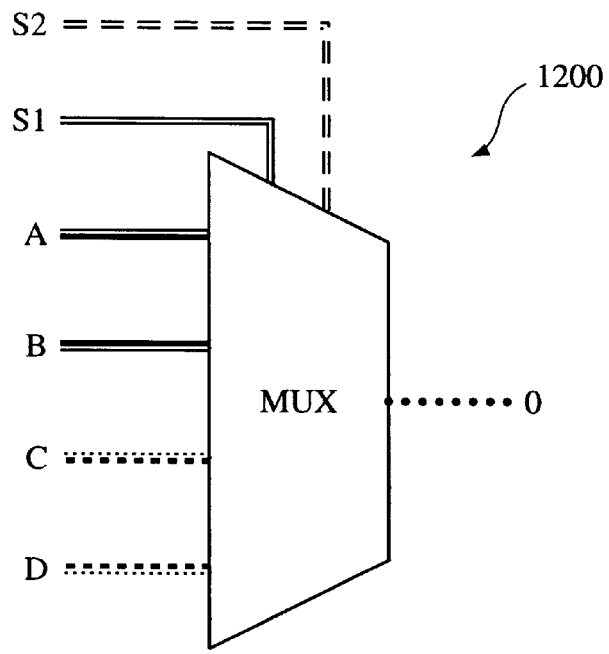
FIGS. 12(A) and 12(B) are simplified circuit diagrams showing a sample logic operation.
Figure 12B:
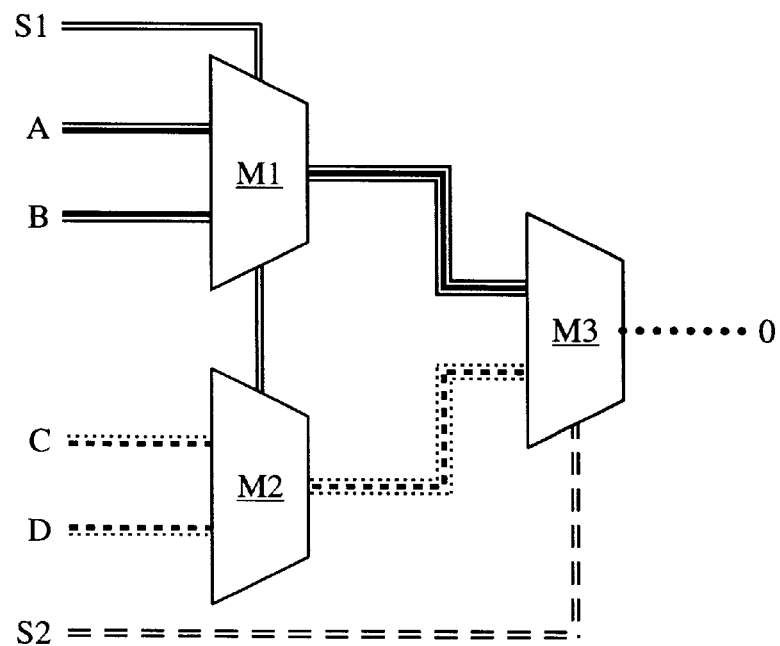
Figure 13A:
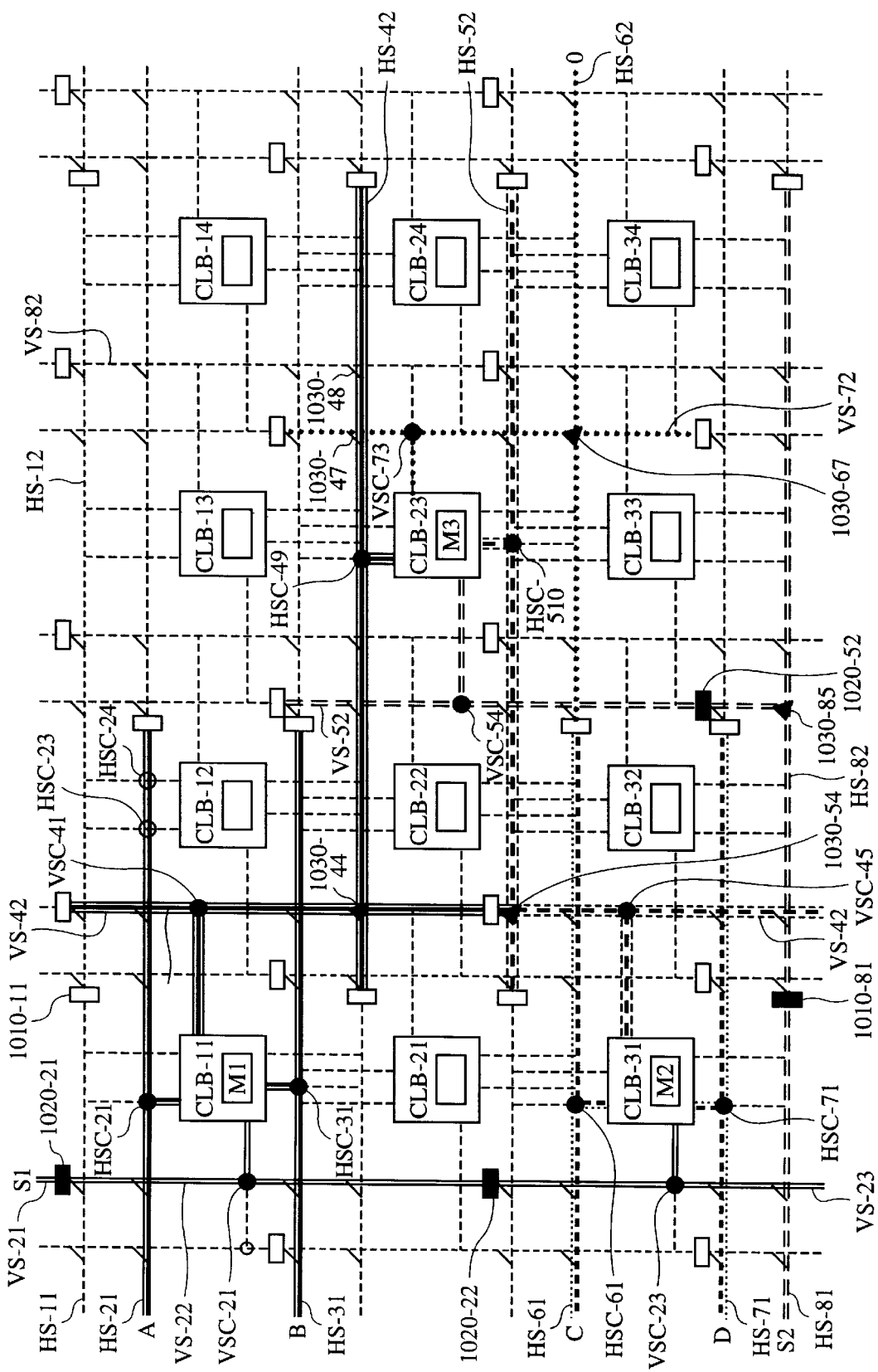
FIGS. 13(A) and 13(B) are diagrams showing an FPGA implementing the sample logic diagram of FIG. 12(B) using an original routing solution and a shifted routing solution, respectively, in accordance with the second embodiment.

FIGS. 12(A), 12(B), 13(A) and 13(B) illustrate an example of a routing solution in accordance with the second embodiment. FIG. 12(A) shows a sample logic operation that is to be implemented by FPGA 900. FIG. 12(B) shows the logic operation after it is broken into portions that can be implemented in the hypothetical CLBs of FPGA 900. FIG. 13(A) shows a sample original routing solution generated in accordance with the second embodiment, and FIG. 13 (B) shows the routing solution after logic portions are shifted toward the spare CLB column.

Referring to FIG. 12(A), the logic operation to be implemented is a four-input multiplexer (MUX) 1200. For explanatory purposes, it is assumed that the CLBs of FPGA 900 have logic resources that are only capable of implementing two-input MUXes. Therefore, as shown in FIG. 12(B), the four-input MUX 1200 is separated into two-input MUXes M1, M2 and M3 according to Step 510 of the place-and-route process (see FIG. 5). Referring to FIG. 12(B), MUX M1 receives input signal A (indicated with a thin-over-thick solid line), input signal B (indicated with a thick-over-thin solid line) and select signal S1 (indicated with a double solid line), and outputs a first signal (indicated with a solid triple line). MUX M2 receives input signal C (indicated with a thin-over-thick dotted line), input signal D (indicated with a thick-over-thin dotted line) and select signal S1, and outputs a second signal (indicated with a dotted triple line). MUX M3 receives the first output signal from MUX M1, the second output signal from MUX M2, and a second select signal S2 (indicated with a double dashed line), and outputs signal O.

FIG. 13(A) shows an original placement-and-routing solution generated in accordance with the second embodiment. Each two-input MUX associated with MUX 1200 is implemented in assigned CLB. For example, MUX M1 is implemented in CLB-11, MUX M2 is implemented in CLB-31, and MUX M3 is implemented in CLB-23. Note that CLB-14, CLB-24 and CLB-34 form a spare row of CLBs of FPGA 900.

In FIG. 13(A), the signal paths associated with the input and output signals of MUX 1200 are indicated by the special lines shown in FIG. 12(B). For example, input signal A is indicated with the thin-over-thick solid line shown on horizontal segment HS-21 that is connected to MUX M1 (CLB-11). Input signal B is indicated with the thick-over-thin solid line shown on horizontal segment HS-31 that is also connected to MUX M1. Input signal C is indicated with the thin-over-thick dotted line shown on horizontal segment HS-61 that is connected to MUX M2 (CLB-31). Input signal D is indicated with the thick-over-thin dotted line shown on horizontal segment HS-71 that is also connected to MUX M2. The output signal from MUX M1 (solid triple line) is transmitted to MUX M3 (CLB-23) via vertical segment VS-42 and horizontal segment HS-42. The output signal from MUX M2 (dotted triple line) is transmitted to MUX M3 via vertical segment VS-42 and horizontal segment HS-52. Finally, the output signal O from MUX M3 (dotted single line) is transmitted on vertical VS-72 and horizontal segment HS-62.

The darkened (filled-in) shapes in FIG. 13(A) indicate the closed (connected) state of switches located between two segments and between a segment and a CLB. For example, filled-in rectangular horizontal-to-horizontal connection switches 1010 (such as 1010-81) indicate a connection between the adjoining horizontal segments (i.e., HS-81 and HS-82). In other words, the pass transistors associated with these switches are turned-on by their associated memory cells to pass signals between the adjoining segments. In contrast, rectangular switches 1010 that are not filled-in (such as 1010-11) indicate open circuits (i.e., segment HS-11 is electrically isolated from segment HS-12). Similarly, darkened vertical-to-vertical connection switches 1020 indicate connections, and switches 1020 that are not filled-in indicate open circuits. Horizontal-to-vertical segment connections are indicated with darkened triangles. For example, the triangle at switch 1030-44 indicates a horizontal-to-vertical segment connection between horizontal segment HS-42 and vertical segment VS-42. Finally, closed segment-to-CLB switches are indicated with darkened circles. For example, the connection between input signal path A (segment HS-21) and CLB-11 is indicated with the darkened circle at horizontal segment-to-CLB connection switch HSC-21.

In accordance with the original routing solution, all of the connections between the horizontal segments and the CLBs are implemented by non-reserved segment-to-CLB connection switches. In other words, connections between these segments and the CLBs are implemented through any connection switch except for a reserved segment-to-CLB switch. For example, signal path A is connected to CLB-11 using switch HSC-21, which is located midway along segment HS-21 (i.e., reserved connection switches HSC-23 and HSC-24, which are located closest to spare CLB-14, are not used).

Also in accordance with the original routing solution, all of the connections between the horizontal segments and the vertical segments are implemented by non-reserved horizontal-to-vertical connection switches. For example, the connection between horizontal segment HS-42 and vertical segment VS-42 is implemented by programming the memory cell associated with switch 1030-44 to pass signals between these segments. Note that reserved horizontal-to-vertical connection switches 1030-47 and 1030-48 of segment HS-42 are not used in the original routing solution.

Figure 13B:
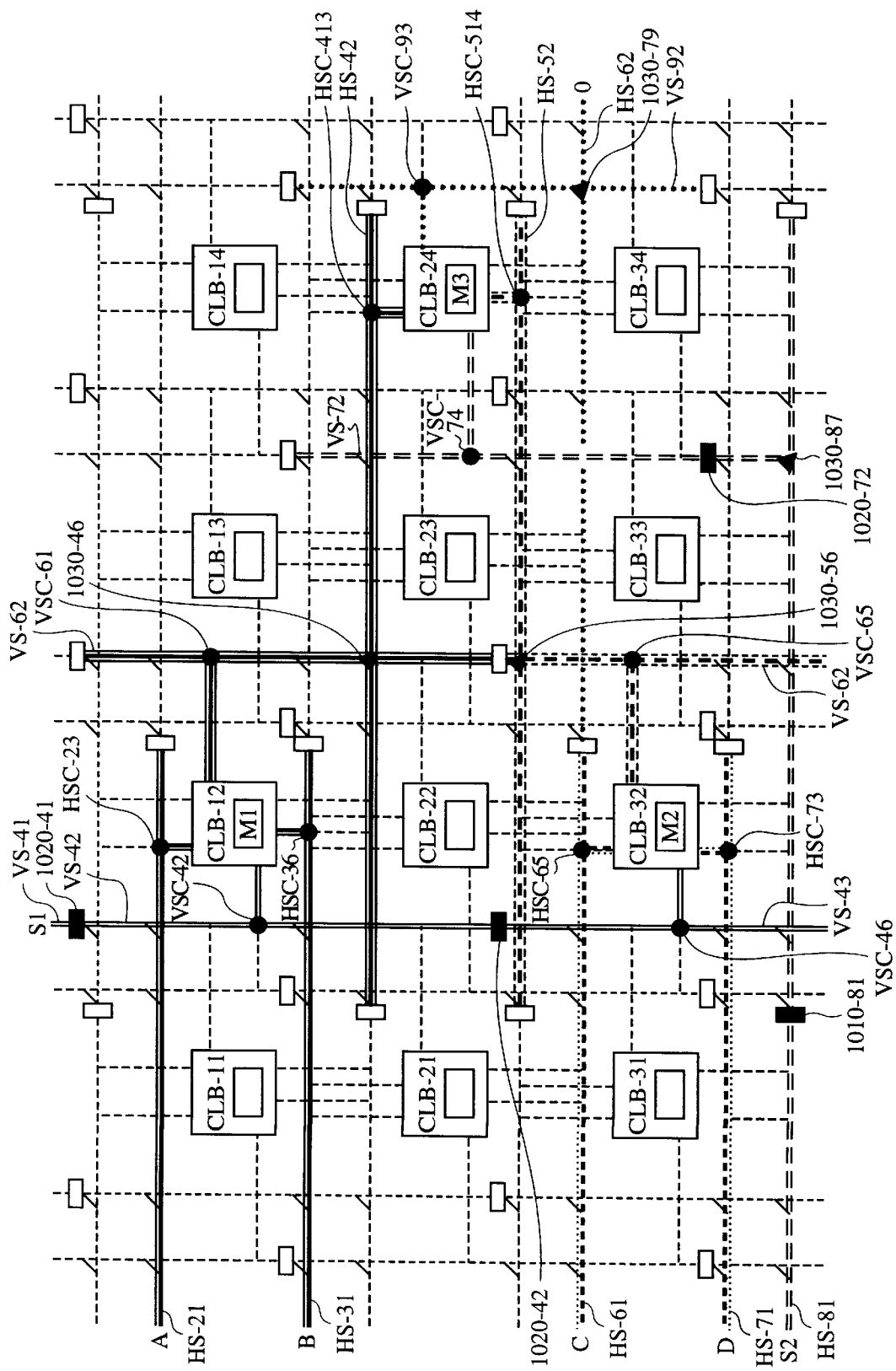

Turning now to FIG. 13(B), it is assumed that one or more of the CLBs in the leftmost column (i.e., CLB-11, CLB-21 or CLB-31) of an actual FPGA 900 are defective. When this occurs, the configuration logic assigned to the CLBs in the defective column (i.e., the CLB column containing the one or more defective CLB) is shifted toward the spare column of CLBs (i.e., CLB-14, CLB-24 and CLB-34) by the configuration logic of the actual FPGA 900. As such, the configuration logic associated with MUX M1 is shifted from CLB-11 to CLB-12, the configuration logic associated with MUX M2 is shifted from CLB-31 to CLB-32, and the configuration logic associated with MUX M3 is shifted from CLB-23 to spare CLB-24.

In addition to the shifted CLB configuration data, configuration data associated with the segment-to-CLB connections is also shifted. For example, the connection between signal path A and MUX M1 is shifted from switch HSC-21 (FIG. 13(A)) to HSC-23, and the connection between signal path B and MUX M1 is shifted from switch HSC-31 (FIG. 13(A)) to HSC-36. Likewise, connections from vertical segments to the CLBs are shifted one vertical channel. For example, the connection between select signal path S1 and MUX M1 is shifted from switch VSC-21 (FIG. 13(A)) to VSC-42, and the connection between signal path S1 and MUX M2 is shifted from switch VSC-23 (FIG. 13(A)) to VSC-46.

Finally, configuration data associated with each horizontal-to-vertical segment connection is also shifted. For example, the horizontal-to-vertical connection utilized by output signal O is shifted from switch 1030-67 (FIG. 13(A)) to switch 1030-79. No additional switches must be turned on.

The fault tolerant routing solution associated with the second embodiment provides the following advantages. First, the shifted placement-and-routing solution does not increase the delay of any signal path. Specifically, the signal paths of the original routing solution have the same timing specification as those of the shifted routing solution because the signals are transmitted on the same horizontal segments in both the original and shifted solutions. For example, input signal A is transmitted on horizontal segment HS-21, which transmits this signal simultaneously to MUX M1 in both the original configuration (i.e., to CLB-11) and in the shifted configuration (i.e., to CLB-12). Similarly, the output from MUX M1 travels through the same number of connections to MUX M3 in both the original and the shifted solution.

Although the present invention may also be beneficially utilized in FPGAs having coincident segment arrangements and unequal segments, the fault tolerance method is particularly useful in FPGAs having equal length, staggered segment arrangements. Further, although the method is described with respect to FPGA 400 having segments spanning two or three CLBS, the beneficial aspects of the present invention are enhanced when the segments span more than three CLBs, such as those shown in FPGA 900. For example, when the segments span four CLBs, a maximum of 25% of all CLBs of the array can be reserved. This percentage is substantially better than the 30% reservation rate of the prior art method taught by Hanchek and Dutt (supra). Further, unlike the method of Hanchek and Dutt, the reserved CLB or segment-to-CLB connections of one segment is typically different from that of another segment. Therefore, from a statistical view, the amount of overhead required by the fault tolerance method of the present invention is substantially lower than 25%.

Although the present invention has been described in considerable detail with reference to certain preferred embodiments thereof, other embodiments are possible. For example, the novel routing process need not be implemented with a WHILE DO loop, and the step of determining whether a reserved CLB is utilized may be eliminated if certain segments are removed from the list of available interconnect resources before the signal path routing solution is determined. Those skilled in the art will also recognize that any number of wires may be used in the channels, wherein only two wires were shown in the above embodiments. Additionally, multiple reserved segments and connections may be provided for each CLB. Finally, reprogramming configuration logic may be accomplished simply by storing the location of the defective row. Therefore, the spirit and scope of the appended claims should not be limited to the description of the preferred embodiments contained herein.

What is claimed is:

1. A method for tolerating a defective logic block in a programmable logic device, the programmable logic device comprising an array of configurable logic blocks including first and second configurable logic blocks arranged in a row, the programmable logic device also including an interconnect channel extending parallel to the row, the interconnect channel including a first interconnect line and a second interconnect line, the first interconnect line having a first wiring segment programmably coupled to a second wiring segment, the first wiring segment also being programmably coupled to the first configurable logic block and the second wiring segment also being programmably coupled to the second configurable logic block, the second interconnect line having a third wiring segment programmably coupled to the first configurable logic block and the second configurable logic block; the method comprising the steps of:

designating a reserved wiring segment for each configurable logic block of the array such that the first wiring segment is designated as the reserved wiring segment for the first configurable logic block;

placing a user's logic operation by assigning portions of the user's logic operation to the array of configurable logic blocks such that a first portion is assigned to the first configurable logic block;

routing the user's logic operation by assigning selected wiring segments to signal paths that transmit signals to the portions of the user's logic operation, wherein the first wiring segment is assigned to a signal path only if the signal path transmits signals to or from a portion assigned to any configurable logic block of the array other than the first configurable logic block;

generating configuration data by combining the portions assigned during the step of placing and the wiring segments assigned during the step of routing; and programming the programmable logic device using the configuration data.

2. The method according to claim 1, wherein the step of assigning selected wiring segments further comprises the steps of:

selecting a first signal path of the user's logic operation that transmits signals to the first configurable logic block;

temporarily removing from a list of available interconnect resources the reserved wiring segment associated with the first configurable logic block;

providing a routing solution for the first signal path by assigning wiring segments to the first signal path from the list of available interconnect resources; and returning the reserved wiring segment to the list of available interconnect resources.

3. The method according to claim 2, wherein the step of assigning selected wiring segments further comprises the steps of:

selecting a second signal path of the user's logic operation that transmits signals to the second configurable logic block; and providing a routing solution for the second signal path by assigning the first wiring segment to the second signal path from the list of available interconnect resources.

4. The method according to claim 1, wherein said programmable logic device further includes configuration logic for transmitting configuration data to the array of configurable logic blocks and to the wiring segments, and wherein the row of configurable logic blocks includes a spare configurable logic block arranged such that the second configurable logic block is located between the first configurable logic block and the spare logic block, and wherein the step of programming further comprises:

testing the programmable logic device to identify a defective configurable logic block; and if the identified defective configurable logic block is the first configurable logic block, then reprogramming the configuration logic of the programmable logic device such that the logic portion assigned to the first configurable logic block is shifted to the second configurable logic block.

5. The method according to claim 4, wherein if a second logic portion is assigned to the second logic block, then the step of reprogramming the configuration logic further comprises shifting the second logic portion to the spare configurable logic block.

6. The method according to claim 4, wherein the third wiring segment and a first connection switch are assigned to the first signal path, wherein configuration logic associated with the first connection switch causes signal transmission from the third wiring segment to the first configurable logic block, and wherein the step of shifting the first logic portion to the second configurable logic block further comprises shifting the configuration logic associated with the first connection switch to a second connection switch programmably coupled between the third wiring segment and the second configurable logic block.

7. A method for tolerating a defective logic block in a programmable logic device including an array of configurable logic blocks, the programmable logic device also including a plurality of continuous wiring segments and a plurality of connection switches, each of the connection switches programmably coupling one of the wiring segments to one of the configurable logic blocks, wherein each wiring segment is programmably coupled to at least two of the plurality of configurable logic blocks in the row via respective connection switches, the method comprising the steps of:

designating a reserved connection switch for each wiring segment, wherein the reserved connection switch is connected between said each wiring segment and an associated configurable logic block;

placing a user's logic operation by assigning portions of the user's logic operation to the array of configurable logic blocks;

routing the user's logic operation by assigning selected wiring segments to signal paths that transmit signals to the portions of the user's logic operation, wherein each selected wiring segment is assigned to a signal path only if the signal path transmits signals through any connection switch of said selected wiring segment other than the reserved connection switch;

generating configuration data by combining the portions assigned during the step of placing and the wiring segments assigned during the step of routing; and programming the programmable logic device using the configuration data.

8. The method according to claim 7, wherein a first wiring segment is connected to a first associated configurable logic block through a first connection switch and a second connection switch, and wherein the step of designating a reserved connection switch further comprises designating the first connection switch and the second connection switch as reserved connection switches for the first wiring segment.

9. The method according to claim 7, wherein the programmable logic device includes a plurality of configurable logic blocks arranged in a row, wherein a first portion of the user's logic operation is assigned to a first configurable logic block in the row, the first configurable logic block being programmably coupled to a first wiring segment through a first connection switch, and wherein the step of assigning selected wiring segments further comprises:

forming a list of available interconnect resources including the first wiring segment and the first connection switch, wherein the list of available interconnect resources does not include the reserved connection switch of the first wiring segment, and assigning the first wiring segment and the first connection switch to a signal path transmitting signals to the first configurable logic block.

10. The method according to claim 9, wherein said programmable logic device further includes configuration logic for transmitting configuration data to the array of configurable logic blocks and to the plurality of wiring segments, and wherein the plurality of configurable logic blocks include the first configurable logic block, a second configurable logic block and a spare configurable logic block, the second configurable logic block being located between the first configurable logic block and the spare logic block, and wherein the step of programming further comprises:

testing the programmable logic device to identify a defective configurable logic block; and if the identified defective configurable logic block is the first configurable logic block, then reprogramming the configuration logic of the programmable logic device such that the first portion assigned to the first configurable logic block is shifted to the second configurable logic block.

11. The method according to claim 10, wherein the step of reprogramming the configuration logic of the programmable logic device further comprises shifting configuration logic associated with the first connection switch to the reserved connection switch such that signals of the signal path are transmitted from the first wiring segment to the first portion that is shifted to the second configurable logic block.

12. A method for tolerating a defective logic block in a programmable logic device, the programmable logic device comprising an array of configurable logic blocks, the programmable logic device also including a plurality of horizontal channels and a plurality of vertical channels located between adjacent configurable logic blocks of the array, each horizontal channel including a plurality of continuous horizontal wiring segments and each vertical channel including a plurality of continuous vertical wiring segments, wherein the programmable logic device also includes a plurality of connection switches programmably coupling the horizontal and vertical wiring segments such that each horizontal wiring segment is programmably coupled to at least two of the vertical wiring segments via respective connection switches, the method comprising the steps of:

designating a reserved connection switch for each horizontal wiring segment, wherein the reserved connection switch is connected between said each horizontal wiring segment and an associated vertical wiring segment;

placing a user's logic operation by assigning portions of the user's logic operation to the array of configurable logic blocks;

routing a user's logic operation by assigning selected wiring segments to signal paths that transmit signals to the portions of the user's logic operation, wherein each selected wiring segment is assigned to a signal path only if the signal path transmits signals through any connection switch of said selected wiring segment other than the reserved connection switch;

generating configuration data by combining the portions assigned during the step of placing and the wiring segments assigned during the step of routing and programming the programmable logic device using the configuration data.

13. The method according to claim 12, wherein a first wiring segment is connected to a first vertical wiring segment through a first connection switch and to a second vertical wiring segment through a second connection switch, wherein the first and second vertical wiring segments are in a first vertical channel, and wherein the step of designating a reserved connection switch further comprises designating the first connection switch and the second connection switch as reserved connection switches for the first horizontal wiring segment.

14. The method according to claim 12, wherein the programmable logic device includes a first configurable logic block that is assigned a first portion of the user's logic operation, a first signal path transmitting signals to the first portion, and a first horizontal wiring segment that includes a reserved connection switch, wherein the step of assigning selected wiring segments further comprises:

forming a list of available interconnect resources including the first horizontal wiring segment, a first vertical wiring segment and a first connection switch programmably coupling the first horizontal wiring segment and the first vertical wiring segment, wherein the list of available interconnect resources does not include the reserved connection switch of the first horizontal wiring segment, and assigning the first horizontal wiring segment, the first vertical wiring segment and the first connection switch to the first signal path.

15. The method according to claim 14, wherein said programmable logic device further includes configuration logic for transmitting configuration data to the array of configurable logic blocks and to the plurality of wiring segments, and wherein the array of configurable logic blocks include the first configurable logic block, a second configurable logic block located adjacent to the third configurable logic block, and a second vertical channel located between the first and second configurable logic blocks, and wherein the step of programming further comprises:

testing the programmable logic device to identify a defective configurable logic block; and if the identified defective configurable logic block is the first configurable logic block, then reprogramming the configuration logic of the programmable logic device such that the first portion assigned to the first configurable logic block is shifted to the second configurable logic block, configuration logic associated with the first vertical wiring segment is shifted to a second vertical wiring segment that is located in the second vertical channel, and shifting configuration logic associated with the first connection switch to the reserved connection switch such that signals of the signal path are transmitted from the first wiring segment to the first portion that is shifted to the second configurable logic block along the second vertical wiring segment.

* * * * *